US012796227B2

(12) United States Patent
Son et al.

(10) Patent No.: US 12,796,227 B2
(45) Date of Patent: Nov. 10, 2026

(54) DISPLAY DEVICE AND METHOD FOR MANUFACTURING THE SAME

(71) Applicant: LG DISPLAY CO., LTD., Seoul (KR)

(72) Inventors: Younghoon Son, Gimpo-si (KR); Daehee Kim, Goyang-si (KR); Jiyoung Park, Seoul (KR); Hyeju Choi, Iksan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 663 days.

(21) Appl. No.: 18/086,858

(22) Filed: Dec. 22, 2022

(65) Prior Publication Data

US 2023/0209911 A1 Jun. 29, 2023

(30) Foreign Application Priority Data

Dec. 28, 2021 (KR) ........................ 10-2021-0189279

(51) Int. Cl.
*H10K 59/122* (2023.01)
*H10K 50/13* (2023.01)
(Continued)

(52) U.S. Cl.
CPC ........... *H10K 59/122* (2023.02); *H10K 50/13* (2023.02); *H10K 50/19* (2023.02); *H10K 59/32* (2023.02);
(Continued)

(58) Field of Classification Search
CPC ... H10K 2102/351; H10K 59/32; H10K 50/19
See application file for complete search history.

(56) References Cited

U.S. PATENT DOCUMENTS 9,716,208 B2 7/2017 Dozen et al.
10,186,680 B2 1/2019 Lee
(Continued)

FOREIGN PATENT DOCUMENTS

CN 103022370 A 4/2013
CN 107464827 A 12/2017
(Continued)

OTHER PUBLICATIONS

Korean Intellectual Property Office, Written Decision on Registration, Korean Application No. 10-2021-0189279, Feb. 11, 2026, all pages. (Year: 2026).*
(Continued)

*Primary Examiner* — Victoria K. Hall
(74) *Attorney, Agent, or Firm* — Birch, Stewart, Kolasch & Birch, LLP

(57) ABSTRACT

A display device including a plurality of pixels disposed on a substrate, each pixel including a plurality of sub-pixels; a first electrode disposed in each sub-pixel and connected to transistors for driving the plurality of sub-pixels to emit light; and a bank including a plurality of bank holes, each bank hole exposing a portion of the first electrode and defining emission light-areas of the sub-pixels. Further, each sub-pixel includes a sub-pixel pattern disposed on a bottom surface of the bank hole and contacting exposed surfaces of the first electrode, and extending continuously on sidewalls of the bank hole and along top outside edge surfaces of the bank. Also, a thickness of the sub-pixel pattern decreases step-by-step as the sub-pixel pattern extends along the top outside edge surfaces of the bank in a direction toward an adjacent sub-pixel.

19 Claims, 29 Drawing Sheets

(51) Int. Cl.

| | |
|---|---|
| ***H10K 50/19*** | (2023.01) |
| ***H10K 59/32*** | (2023.01) |
| ***H10K 59/35*** | (2023.01) |
| ***H10K 59/80*** | (2023.01) |
| ***H10K 71/20*** | (2023.01) |
| ***H10K 71/60*** | (2023.01) |
| ***H10K 85/10*** | (2023.01) |
| *H10K 102/00* | (2023.01) |

(52) U.S. Cl.
CPC ..... *H10K 59/353* (2023.02); *H10K 59/80522* (2023.02); *H10K 71/221* (2023.02); *H10K 71/60* (2023.02); *H10K 2102/351* (2023.02)

(56) References Cited

U.S. PATENT DOCUMENTS

| | | | | |
|---|---|---|---|---|
| 11,049,916 | B2 | 6/2021 | Lee et al. | |
| 11,056,547 | B2 | 7/2021 | Lee | |
| 11,569,317 | B2 | 1/2023 | Lee et al. | |
| 11,730,014 | B2 | 8/2023 | Kim et al. | |
| 12,035,544 | B2 | 7/2024 | Lee et al. | |
| 2013/0069077 | A1* | 3/2013 | Song | H10K 50/19 257/E33.013 |
| 2014/0158995 | A1 | 6/2014 | Park | |
| 2015/0102316 | A1 | 4/2015 | Park et al. | |
| 2016/0093680 | A1 | 3/2016 | Paek et al. | |
| 2016/0190225 | A1* | 6/2016 | Kim | H10K 59/131 438/23 |
| 2017/0200776 | A1* | 7/2017 | Park | H10K 59/80522 |
| 2017/0352712 | A1* | 12/2017 | Lee | H10K 50/171 |
| 2018/0261797 | A1* | 9/2018 | Lee | H10K 59/352 |
| 2019/0280063 | A1* | 9/2019 | Lee | H10K 59/122 |
| 2020/0152719 | A1* | 5/2020 | Lee | H10K 50/171 |
| 2020/0194522 | A1 | 6/2020 | Lee et al. | |
| 2020/0212143 | A1* | 7/2020 | Jeong | H10K 59/35 |
| 2020/0243790 | A1 | 7/2020 | Lee et al. | |
| 2020/0411614 | A1* | 12/2020 | Kim | H10K 59/121 |
| 2021/0327981 | A1 | 10/2021 | Lee | |
| 2023/0397455 | A1 | 12/2023 | Kim et al. | |

FOREIGN PATENT DOCUMENTS

| | | | |
|---|---|---|---|
| CN | 111326549 | A | 6/2020 |
| CN | 111384129 | A | 7/2020 |
| JP | 2007-258163 | A | 10/2007 |
| JP | 2009-181932 | A | 8/2009 |
| JP | 2014-123527 | A | 7/2014 |
| JP | 2019-133921 | A | 8/2019 |
| JP | 2020-30933 | A | 2/2020 |
| KR | 10-2012-0044876 | A | 5/2012 |
| KR | 10-2017-0137977 | A | 12/2017 |
| KR | 10-2018-0104225 | A | 9/2018 |
| KR | 10-2019-0107257 | A | 9/2019 |
| KR | 10-2020-0080491 | A | 7/2020 |
| KR | 10-2021-0002165 | A | 1/2021 |
| TW | 20123032 | A | 7/2012 |
| TW | 202101756 | A | 1/2021 |

OTHER PUBLICATIONS

The State Intellectual Property Office of People's Republic of China, First Office Action, Chinese Application No. 202211671992.1, Aug. 28, 2026, all pages. (Year: 2026).*

* cited by examiner

DISPLAY DEVICE AND METHOD FOR MANUFACTURING THE SAME

CROSS-REFERENCE TO RELATED APPLICATION

This application claims priority to Korean Patent Application No. 10-2021-0189279 filed on Dec. 28, 2021, in the Korean Intellectual Property Office, and all the benefits accruing therefrom under 35 U.S.C. 119, the entire contents of which are hereby expressly incorporated by reference into the present application.

BACKGROUND OF THE DISCLOSURE

Field

The present disclosure relates to a display device, and more particularly, to a display device in which an organic light-emitting layer is formed using an undercut structure composed of a double layer and a method for manufacturing the same.

Description of Related Art

An organic light-emitting display device includes a self-emissive element. A time taken for the device to convert an electrical signal to light is short, and the generated light spreads out uniformly without directionality. The organic light-emitting display device has excellent color rendering, viewing angle, contrast ratio, and fast response rate, and thus can be used to manufacture a display device for realizing a high-quality moving image. Further, the organic light-emitting display device has an overall small thickness, and thus is thinner than a liquid crystal display device (LCD) or a plasma display device (PDP). Thus, the organic light-emitting display device is developed into a large-area, high-definition next-generation display.

An organic light-emitting layer of the organic light-emitting display device is formed in each sub-pixel on a substrate using a fine metal mask (FMM). However, sagging occurs in a central portion of the FMM due to thinness of the fine metal mask, the FMM scheme. As demand for a panel having a large area continues to increase and a need to form sub-pixel patterns into fine patterns to improve image quality is increasing, research on forming a sub-pixel pattern is ongoing.

SUMMARY OF THE DISCLOSURE

Accordingly, one object of the present disclosure is to address the above-noted and other problems in the related art.

Another object of the present invention is to provide a display device including a sub-pixel pattern formed using a patterning scheme using an undercut structure composed of a double layer, and a manufacturing method thereof.

Still another object of the present disclosure is to provide a display device and a manufacturing method thereof in which sub-pixel patterns are formed using a patterning scheme using an undercut structure composed of a double layer, thereby realizing a finer pattern than that achieved using the FMM.

Another object of the present disclosure is to provide a display device and a manufacturing method thereof in which a large area panel has sub-pixel patterns formed using a patterning scheme using an undercut structure composed of a double layer.

Purposes of the present disclosure are not limited to the above-mentioned purpose. Other purposes and advantages of the present disclosure that are not mentioned may be understood based on following descriptions, and can be more clearly understood based on embodiments of the present disclosure. Further, it will be easily understood that the purposes and advantages of the present disclosure can be realized using means shown in the claims and combinations thereof.

To achieve these and other advantages and in accordance with the purpose of the present invention, as embodied and broadly described herein, the present invention provides in one aspect a display device including a plurality of pixels disposed on a substrate, each pixel including a plurality of sub-pixels; a first electrode disposed in each sub-pixel and connected to transistors for driving the plurality of sub-pixels to emit light; and a bank including a plurality of bank holes, each bank hole exposing a portion of the first electrode and defining emission light-areas of the sub-pixels. Further, each sub-pixel includes a sub-pixel pattern disposed on a bottom surface of the bank hole and contacting exposed surfaces of the first electrode, and extending continuously on sidewalls of the bank hole and along top outside edge surfaces of the bank. Also, a thickness of the sub-pixel pattern decreases step-by-step as the sub-pixel pattern extends along the top outside edge surfaces of the bank in a direction toward an adjacent sub-pixel.

Effects of the present disclosure are not limited to the above-mentioned effects, and other effects as not mentioned will be clearly understood by those skilled in the art from following descriptions.

BRIEF DESCRIPTION OF DRAWINGS

The present disclosure will become more fully understood from the detailed description given hereinbelow and the accompanying drawings which are given by way of illustration only, and thus are not limitative of the present disclosure and wherein.

DETAILED DESCRIPTION OF THE EMBODIMENTS

Figure 1:
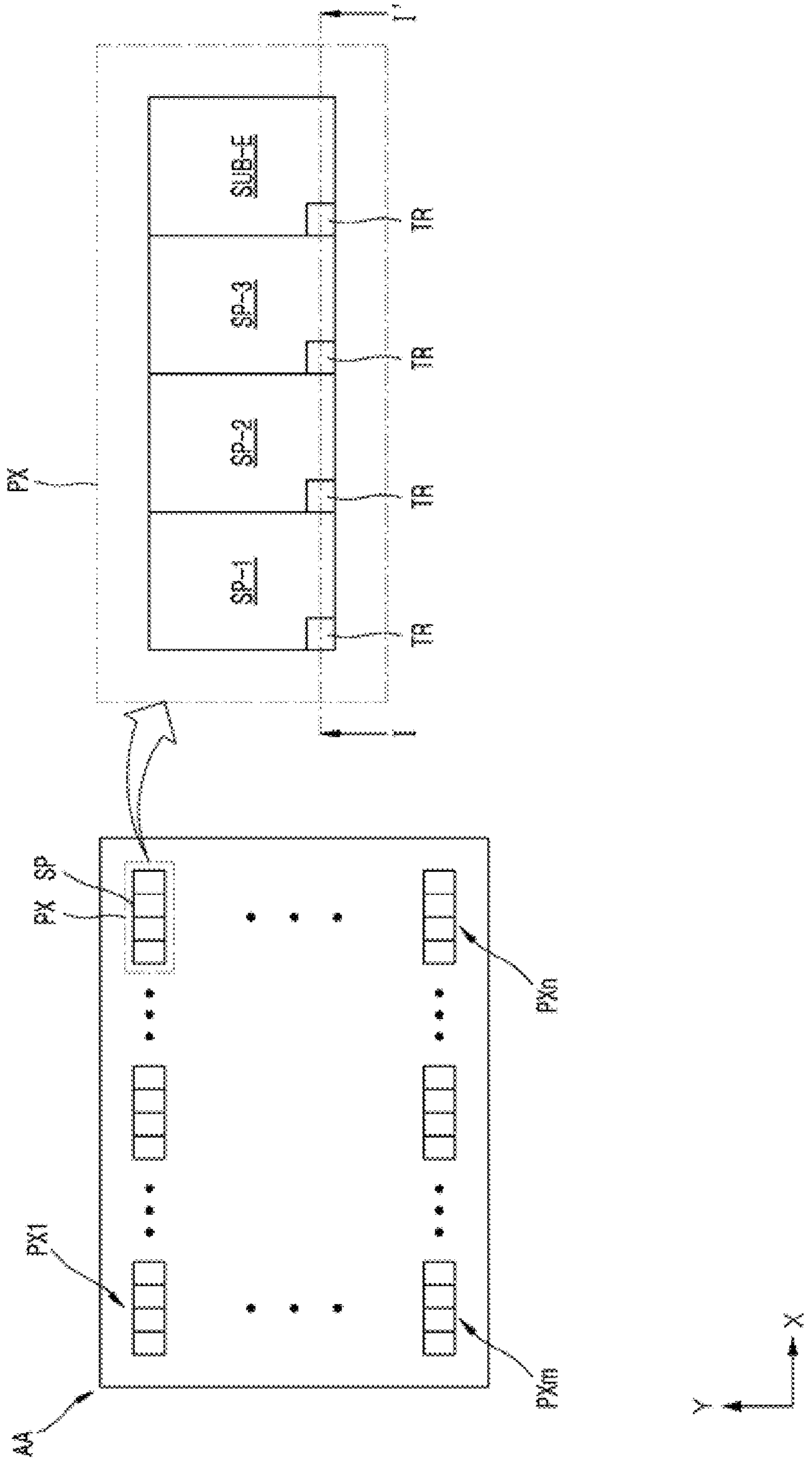
FIG. 1 is a plan view schematically showing a display area of a display device.

Advantages and features of the present disclosure, and a method of achieving the advantages and features will become apparent with reference to embodiments described later in detail together with the accompanying drawings. However, the present disclosure is not limited to embodiments as disclosed below, and may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify an entirety of list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. In interpreting a numerical value, the value is interpreted as including an error range unless there is no separate explicit description thereof.

In one implementation of the invention, the expression "a substantial amount of fluorine" can mean that the number of fluorine atoms amounts up to 50% or more, or 60%, 70%, 80% or 90% or more of the total number of atoms of a molecule, a polymer, a material or a functional group.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other and may be technically associated with each other or operate with each other. The embodiments may be implemented independently of each other and may be implemented together in an association relationship. In descriptions of temporal relationships, for example, temporal precedent relationships between two events such as "after," "subsequent to," "before," etc., another event may occur therebetween unless "directly after," "directly subsequent" or "directly before" is not indicated.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device formed using a double-layer undercut structure according to embodiments of the present disclosure and a method for manufacturing the same will be described with reference to the drawings. In particular, FIG. 1 is a plan view schematically showing a display area of a display device, FIG. 2 is a cross-sectional view cut along a I-I' direction of FIG. 1, and FIG. 3 is a diagram shown for illustrating one pixel pattern.

Figure 2:
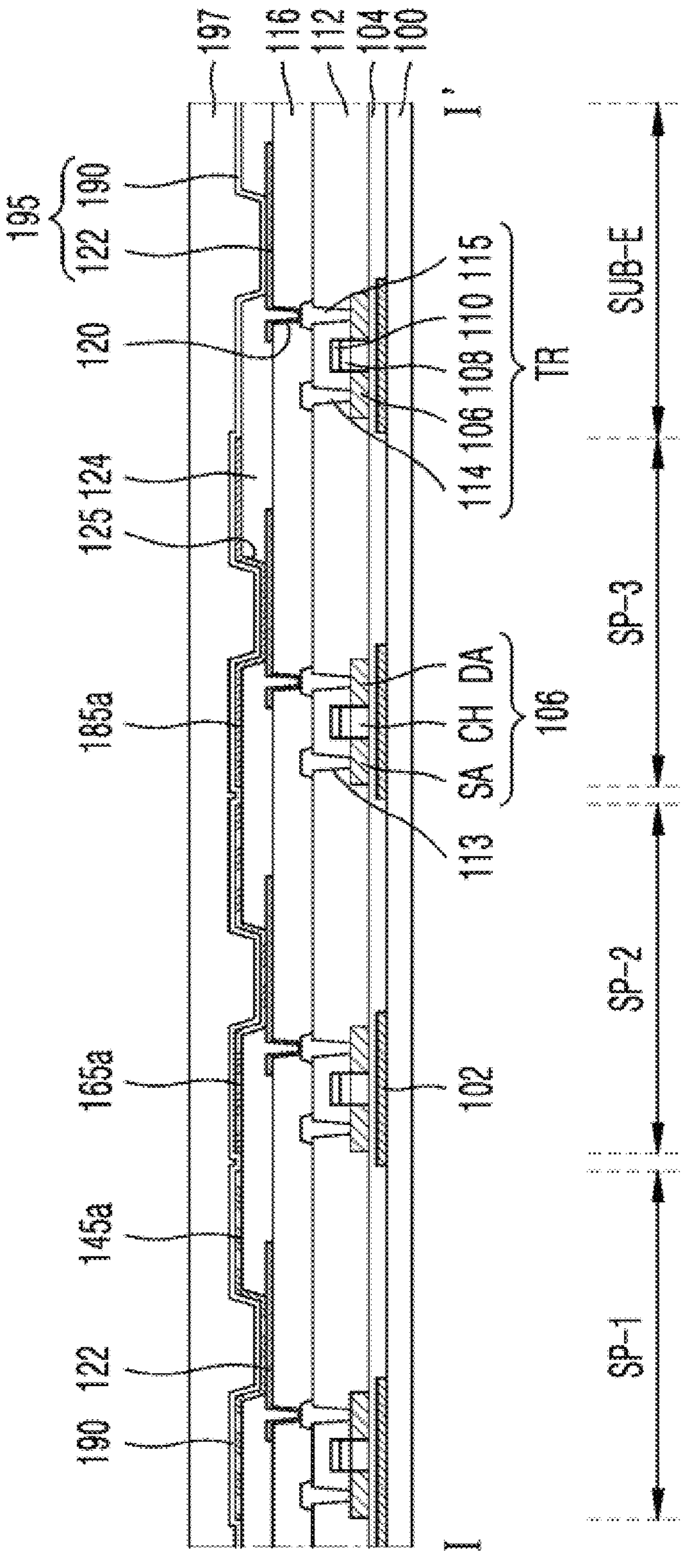
FIG. 2 is a cross-sectional view cut along a I-I' direction of FIG. 1.
Figure 3:
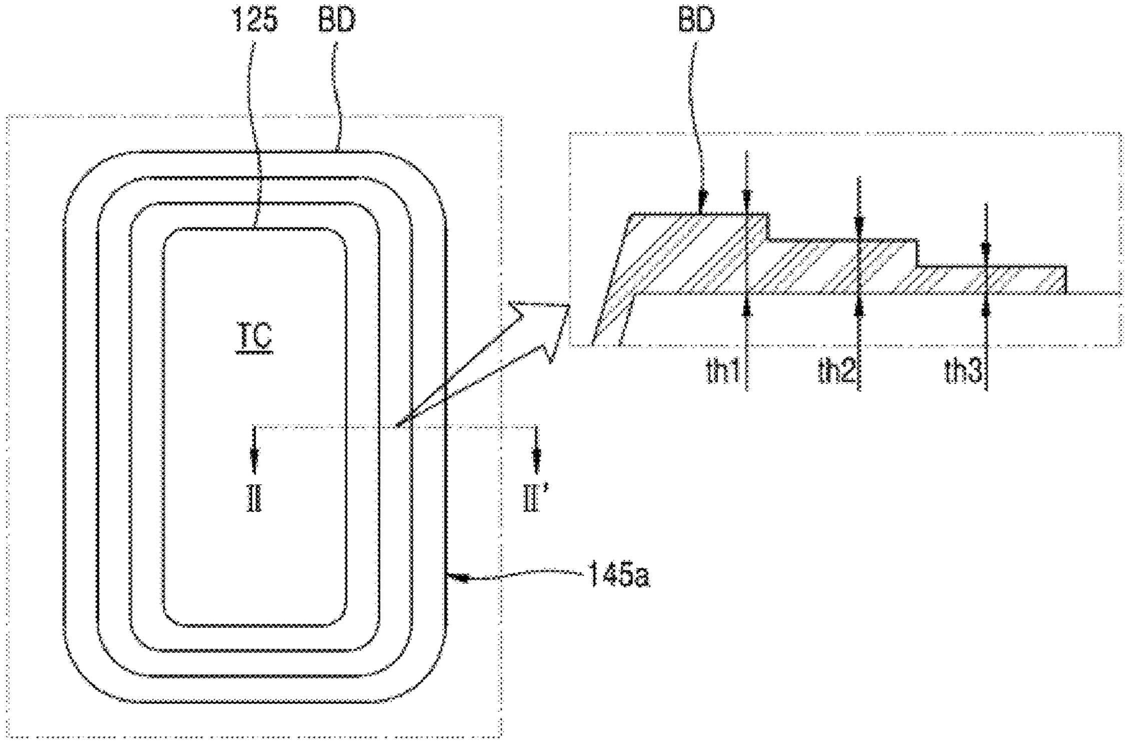
FIG. 3 is a diagram illustrating one sub-pixel pattern.

Referring to FIGS. 1 to 3, a display area AA of the display device refers to an area for displaying an image. As shown, a plurality of pixels PX are disposed in the display area AA. The plurality of pixels PX can be arranged in a matrix form (PX1 . . . . PXm, PXn, each of m and n is a natural number) along a first direction X and a second direction Y intersecting the first direction X in the display area AA (active area). In addition, one pixel PX includes a plurality of sub-pixels SP. In more detail, the sub-pixel SP refers to a basic color element in which actual light is emitted and can be defined as a minimum light-emitting unit area. Each sub-pixel SP also includes an organic light-emitting element as a self-emissive element, and a thin-film transistor TR to drive the organic light-emitting element.

In one example, referring to an enlarged view of one pixel PX in FIG. 1, adjacent sub-pixel SPs may include a first sub-pixel SP_1, a second sub-pixel SP_2, a third sub-pixel SP_3 and a sub-pixel SUB_E indicating an auxiliary electrode. The different sub-pixels constitute one pixel PX. When the display area AA displays a color image, the first sub-pixel SP_1, the second sub-pixel SP_2 and the third sub-pixel SP_3 can emit light beams of different colors, respectively, such as red, green and blue colors. The different emitted colors can also include a white color.

In addition, the sub-pixel SUB_E for the auxiliary electrode can be disposed in each pixel PX to prevent unbalanced driving voltages. Further, the lines for applying the driving voltages to the pixels PX are disposed in a non-display area located outside the display area AA. Accordingly, because of the spacing between the pixels PX arranged in the display area AA in the matrix form and the lines disposed in the non-display area occurs, the driving voltage may be applied in a non-uniform manner, so that the luminance becomes non-uniform depending on a position of the pixel PX. To prevent the luminance from becoming non-uniform due to the imbalanced driving voltages, each pixel PX may further include the sub-pixel SUB E for an auxiliary electrode.

As shown in FIG. 2, the auxiliary electrode sub-pixel SUB_E includes a second electrode 190 and a first electrode 122 in direct contact with each other. Further, the pixels SUB_E for the auxiliary electrode can extend a mesh shape in the display area AA in a plan view. In FIG. 2, the first electrode 122 of the sub-pixel SUB_E is connected to a thin-film transistor TR in the display area AA. However, the present disclosure is not limited thereto. For example, the first electrode 122 may not be connected to the thin-film transistor TR in the display area AA.

In addition, the embodiment in FIG. 2 illustrates the display device including a substrate 100, a light-blocking layer 102, a buffer layer 104, the thin-film transistor TR, an interlayer insulating film 112, a planarization film 116, the first electrode 122, a bank 124, a plurality of pixel patterns 145*a*, 165*a*, and 185*a*, the second electrode 190 and an encapsulation layer 197.

As shown, the light-blocking layer 102 is disposed on the substrate 100 so as to overlap the thin-film transistor TR. The buffer layer 104 is disposed to cover the light-blocking layer 102, and the thin-film transistor TR is disposed on the buffer layer 104. Further, in FIG. 2, the thin-film transistor TR includes an active area 106, a gate electrode 110, a source electrode 114, and a drain electrode 115. The active area 106 includes a channel area CH overlapping the gate electrode 110, and a source area SA and a drain area DA while the channel area CH is interposed therebetween. The gate electrode 110 is disposed on the active area 106 while a gate insulating film 108 is interposed therebetween.

In addition, as shown, the interlayer insulating film 112 covers an entirety of each of the active area 106 and the gate electrode 110, and includes first contact holes 113 exposing a portion of a surface of the active area 106. The source electrode 114 and the drain electrode 115 are in contact with the source area SA and the drain area DA, respectively, via the first contact holes 113.

The planarization film 116 includes a second contact hole 120 exposing a portion of a surface of the drain electrode 115 disposed on the interlayer insulating film 112. The first electrode 122 is also disposed on the planarization film 116. In addition, the first electrode 122 contacts the drain electrode 115 exposed through the second contact hole 120 and thus is electrically connected to the gate electrode 110. The first electrode 122 can also be referred to as an anode electrode or a pixel electrode and be divided into portions corresponding to a plurality of sub-pixels SP-1, SP-2, and SP-3, respectively.

Also, a plurality of banks 124 are disposed on the planarization film 116 so as to define light-emitting areas of the sub-pixels SP-1, SP-2, and SP-3, respectively and thus define each sub-pixel SP-1, SP-2, and SP-3. A portion of a surface of the first electrode 122 of each sub-pixel SP-1, SP-2, and SP-3 is exposed through a bank hole 125 defined in the bank 124.

In addition, each sub-pixel pattern 145*a*, 165*a*, and 185*a* is disposed on an exposed surface of the first electrode 122 of each sub-pixel SP-1, SP-2, and SP-3, and on a sidewall and a top surface of the bank 124. The sub-pixel patterns 145*a*, 165*a*, 185*a* include a first sub-pixel pattern 145*a* disposed in the first sub-pixel SP-1, a second sub-pixel pattern 165*a* disposed in the second sub-pixel SP-2 and a third sub-pixel pattern 185*a* disposed in the third sub-pixel SP-3. The first sub-pixel pattern 145*a* to the third sub-pixel pattern 185*a* can emit light beams of red, green, and blue colors, respectively. However, the present disclosure is not limited thereto.

Referring to FIG. 3, each of the first sub-pixel pattern 145*a* to the third sub-pixel pattern 185*a* can have a rectangular shape including an outer portion BD and an inner trench portion TC disposed inwardly of the outer portion BD in a plan view. As shown, the outer portion BD of the first sub-pixel can be located on the top surface of the bank 124, and the inner trench portion TC can be located inwardly of the outer portion BD and overlap the bank hole 125 disposed between adjacent banks 124. FIG. 3 shows only the first sub-pixel pattern 145*a* for convenience of description. However, each of the second sub-pixel pattern 165*a* and the third sub-pixel pattern 185*a* can have the same structure as that of the first sub-pixel pattern 145*a*.

Further, each sub-pixel pattern 145*a*, 165*a*, and 185*a* can have a thickness increasing step by step (th1, th2, and th3) as the pattern extends toward the bank hole 125. In other words, each of the sub-pixel patterns 145*a*, 165*a*, and 185*a* can cover the inner trench portion TC defined in the bank hole 125 and extend on and along the top surface of the bank 124 such that the thickness thereof decreases step by step (th1, th2, and th3) as the pattern extends toward another adjacent sub-pixel pattern. Accordingly, each sub-pixel pattern 145*a*, 165*a*, and 185*a* can have the largest first thickness th1 at the innermost area of the outer portion BD adjacent to the inner trench portion TC and the smallest third thickness th3 at the outermost area of the outer portion BD.

In addition, the outer portion BD of each sub-pixel pattern 145*a*, 165*a*, and 185*a* has a shape in which inner, middle, and outer rings are arranged toward a sub-pixel pattern adjacent thereto in a plan view. Further, the inner, middle, and outer rings can be arranged in a stepped manner such that the inner ring has the largest thickness, and the outer ring has the smallest thickness.

Thus, as the thickness of the outer portion BD of each sub-pixel pattern 145*a*, 165*a*, and 185*a* decreases as the pattern extends outwardly, leakage current can be reduced. In one example, as the third thickness th3 at the outermost area of the outer portion BD has a small thickness sized such that electric charges do not travel through the outermost area of the outer portion BD, the leakage current can be reduced. Further, as the inner, middle, and outer rings of the outer portion BD of each sub-pixel pattern 145*a*, 165*a*, and 185*a* are arranged in a stepped manner in a plan view, the electrical resistance is rapidly increased between the rings. Further, this rapid increase is repeated. Thus, the leakage current can be reduced more effectively.

In addition, the second electrode 190 commonly contacting the first sub-pixel pattern 145*a*, the second sub-pixel pattern 165*a*, and the third sub-pixel pattern 185*a* can be disposed on the bank 124. The second electrode 190 may also be referred to as a cathode electrode, and supplies electrons to each sub-pixel pattern 145*a*, 165*a*, and 185*a*. In one example, the second electrode 190 directly contacts the first electrode 122 in the sub-pixel SUB_E for the auxiliary electrode. In the sub-pixel SUB_E, the first electrode 122 and the second electrode 190 can constitute an auxiliary electrode 195. Accordingly, the first sub-pixel pattern 145*a*, the second sub-pixel pattern 165*a*, the third sub-pixel pattern 185*a*, and the auxiliary electrode 195 can constitute one group, that is, one pixel.

As shown in FIG. 2, the encapsulation layer 197 can be disposed on the second electrode 190. The encapsulation layer 197 blocks invasion of moisture or oxygen from an outside into the light-emitting element to improve reliability of the display device. The encapsulation layer 197 may be a single layer made of an inorganic or organic material, or as a multilayer in which inorganic and organic layers are stacked.

In a display device according to a first embodiment of the present disclosure, each sub-pixel pattern includes a rectangular shape including the outer portion and an inner trench portion disposed inwardly thereof in a plan view. Further, a thickness of each of the outer portion of the corresponding sub-pixel pattern increases step by step as the pattern extends toward the bank hole. In other words, each sub-pixel pattern includes the inner trench portion corresponding to the bank hole and extending on and along the top surface of the bank such that the thickness thereof decreases step by step as the pattern extends toward another sub-pixel pattern adjacent thereto. Thus, as the thickness of the sub-pixel pattern gradually becomes smaller as the pattern extends outwardly, the leakage current can be reduced.

Hereinafter, a manufacturing method according to embodiments of the present disclosure will be described with reference to the drawings. In particular, FIGS. 4-19 illustrate a method for manufacturing an organic light-emitting display device according to the first embodiment of the present disclosure. FIGS. 4-19 are diagrams as cut out along a the I-I' direction of FIG. 1.

Figure 4:
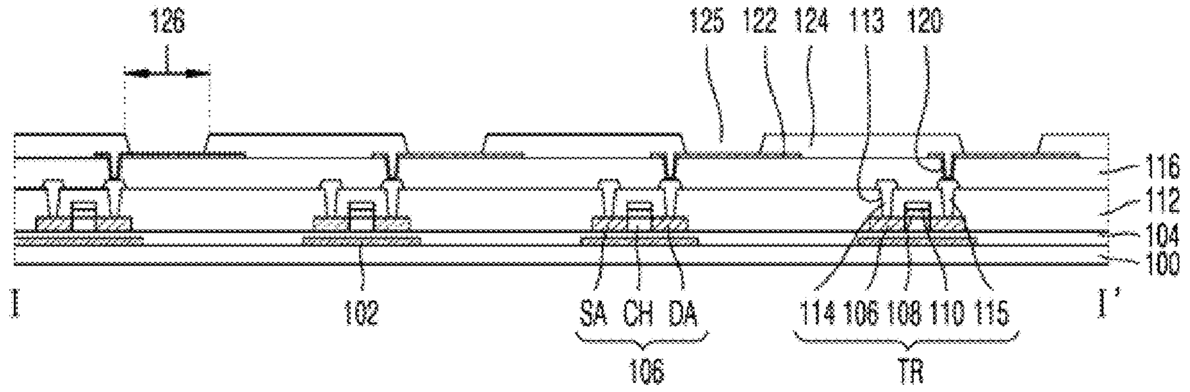
FIGS. 4 to 19 are diagrams illustrating an organic light-emitting display device according to a first embodiment of the present disclosure.

Referring to FIG. 4, the light-blocking layer 102 is formed on the substrate 100, and the buffer layer 104 covering an entire surface of the substrate 100 is formed on the light-blocking layer 102. The substrate 100 may be a light-transmissive substrate, and may be made of a hard material such as glass or tempered glass, or may be made of a plastic material. However, the present disclosure is not limited thereto.

Further, the light-blocking layer 102 is disposed to overlap the active area 106 thereon so as to protect the thin-film transistor TR from light incident from the outside, thereby preventing an off current from occurring in the thin-film transistor TR. Also, the buffer layer 104 blocks invasion or permeation of moisture or oxygen from the substrate 100 toward the organic light-emitting element thereon and protects the thin-film transistor TR from ions or impurities. Further, the buffer layer 104 electrically insulates the light-blocking layer 102, and may be embodied as a single layer including an organic insulating film or an inorganic insulating film made of silicon oxide ($SiO_x$), silicon nitride ($SiN_x$), or silicon oxynitride (SiON), or as a stack structure of an inorganic insulating film and an organic insulating film.

The thin-film transistor TR can be disposed on the buffer layer 104. In the first embodiment of the present disclosure, the thin-film transistor TR includes the active area 106, the gate electrode 110, the source electrode 114 and the drain electrode 115. As shown, the gate electrode 110 is positioned to overlap the channel area CH of the active area 106, and the gate insulating film 108 is disposed between the gate electrode 110 and the channel area CH of the active area 106. The gate electrode 110 may be made of one selected from metals including chromium (Cr), molybdenum (Mo), aluminum (Al), gold (Au), titanium (Ti), nickel (Ni), copper (Cu), neodymium (Nd), and the like, or alloys thereof.

In addition, the active area 106 includes the channel area CH, and the source area SA and the drain area DA facing each other while the channel area CH is interposed therebetween. The active area 106 may include at least one of amorphous silicon, polycrystalline silicon, or an oxide semiconductor.

The interlayer insulating film 112 can be formed on the thin-film transistor TR. In particular, the interlayer insulating film 112 can be formed on the gate electrode 110 and the active area 106, and over an entire surface of the substrate 100 and be formed to have a thickness sized such that the insulating film 112 covers an entirety of a top surface of the gate electrode 110. The interlayer insulating film 112 may include a single layer of an inorganic insulating film or include a stack of an inorganic insulating film and an organic insulating film.

The interlayer insulating film 112 also includes the first contact holes 113 extending through the interlayer insulating film 112 so as to expose a portion of a surface of the active area 106. The first contact holes 113 are then respectively filled with the source electrode 114 and the drain electrode 115.

Thus, the source electrode 114 is electrically connected to the source area SA of the active area 106, and the drain electrode 115 is electrically connected to the drain area DA of the active area 106. The source electrode 114 and the drain electrode 115 are also disposed to be spaced apart from each other while the gate electrode 110 is interposed therebetween. Each of the source electrode 114 and the drain electrode 115 can fill the first contact hole 113 and cover a portion of a top surface of the interlayer insulating film 112.

The planarization film 116 including the second contact hole 120 is disposed on the interlayer insulating film 112. As shown, the planarization film 116 has a thickness sized such that a top surface thereof on the substrate 100 is planarized while an entire surface of the substrate 100 is covered therewith. The second contact hole 120 extending through the planarization film 116 is formed to expose a portion of a surface of the drain electrode 115.

In addition, the first electrode 122 is formed on the planarization film 116 and electrically connected to the gate electrode 110 via the drain electrode 115 exposed through the second contact hole 120. The first electrode 122 may be made of a transparent metal oxide such as indium-tin-oxide (ITO) or indium-zinc-oxide (IZO), and may also be referred to as an anode electrode or a pixel electrode. The first electrode 122 is also divided into portions which may be spaced apart from each other and correspond to the sub-pixels.

Further, the bank 124 including the bank hole 125 is formed on the planarization film 116. In particular, the bank 124 functions as a boundary area defining a light-emitting area 126 of the pixel, and defines each pixel. That is, the bank 124 acts as a barrier to prevent light beams of different colors of adjacent pixels from being mixed with each other. The bank 124 also spaces the portions of the first electrode 122 from each other such that the portions correspond to the sub-pixels.

In addition, the bank 124 may be made of an inorganic insulating material such as silicon nitride ($SiN_x$) or silicon oxide ($SiO_x$) or an organic insulating material such as polyimide. The bank 124 is also formed to cover a remaining area except for the exposed portion of the first electrode 122 in the light-emitting area 126 defined by the bank hole 125 and may have a trench shape.

Figure 5:
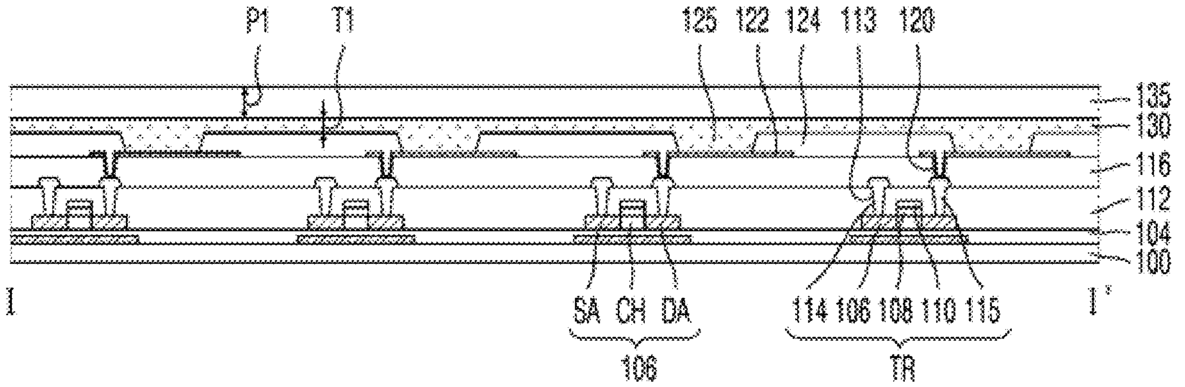

Referring to FIG. 5, a first protective layer 130 and a first photoresist layer 135 are formed on the bank 124 and over the entire surface of the substrate 100. The first protective layer 130 prevents the organic light-emitting layer to be subsequently formed from being damaged during a process step, for example, from being damaged by an etchant.

The first protective layer 130 also fills an entirety of the bank hole 125 and has a first thickness T1 on a surface of the bank 124. In one example, the first protective layer 130 may be made of fluropolymer in which carbon-carbon bonds are continuously arranged in a chain structure so as to have orthogonality, and which contains a large amount of fluorine (F) at a functional group thereof. The orthogonality may be understood as a property in which two objects are not related to each other but exist independently of each other. Accordingly, the first protective layer 130 can have both of a hydrophobic characteristic of having a low affinity with water and an oleophobic characteristic of having a low affinity with oil. Under this orthogonality, the first protective layer 130 can be separated from moisture or reject the moisture. Further, the first protective layer 130 can be less affected by a developer including an organic solvent used in a process step. Accordingly, damage to the first protective layer 130 caused by the organic solvent can be prevented.

In addition, the first photoresist layer 135 formed on the first protective layer 130 may be made of one of a positive type or negative type photoresist material. In an embodiment of the present disclosure, the first photoresist layer 135 may be made of a positive type photoresist material. The first photoresist layer 135 preferably has a first thickness P1. In this case, the first photoresist layer 135 can be prevented from being depressed downwardly or collapsing in a subsequent process of forming an undercut area.

Figure 6:
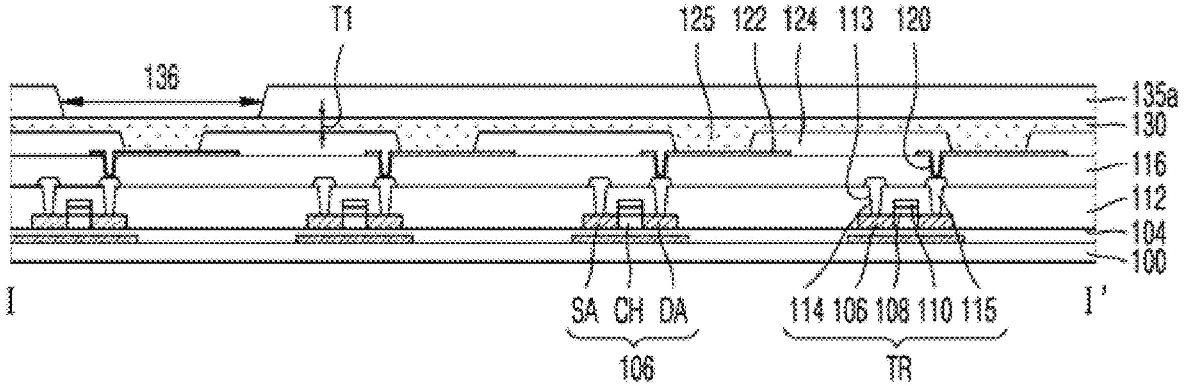

Referring to FIG. 6, a first photoresist pattern 135*a* including an opening area 136 defines an area for the formation of the first pixel pattern of the organic light-emitting layer. For example, a photomask having an opening defined therein at a position corresponding to the opening area 136 and exposing a portion of the first photoresist layer (135 in FIG. 5) is placed on the first photoresist layer 135. Light such as ultraviolet (UV) light is irradiated to the exposed portion of the first photoresist layer 135 exposed through the opening of the photomask. Next, a developing process of removing the first photoresist layer 135 is performed using a developer, such that only the portion of the first photoresist layer 135 exposed to ultraviolet (UV) light is selectively removed. The first photoresist pattern 135*a* is then formed which has the opening area 136 defining the area where the first sub-pixel pattern of the organic light-emitting layer is to be formed. A portion of a surface of the first protective layer 130 is exposed through the opening area 136 of the first photoresist pattern 135*a*.

Figure 7:
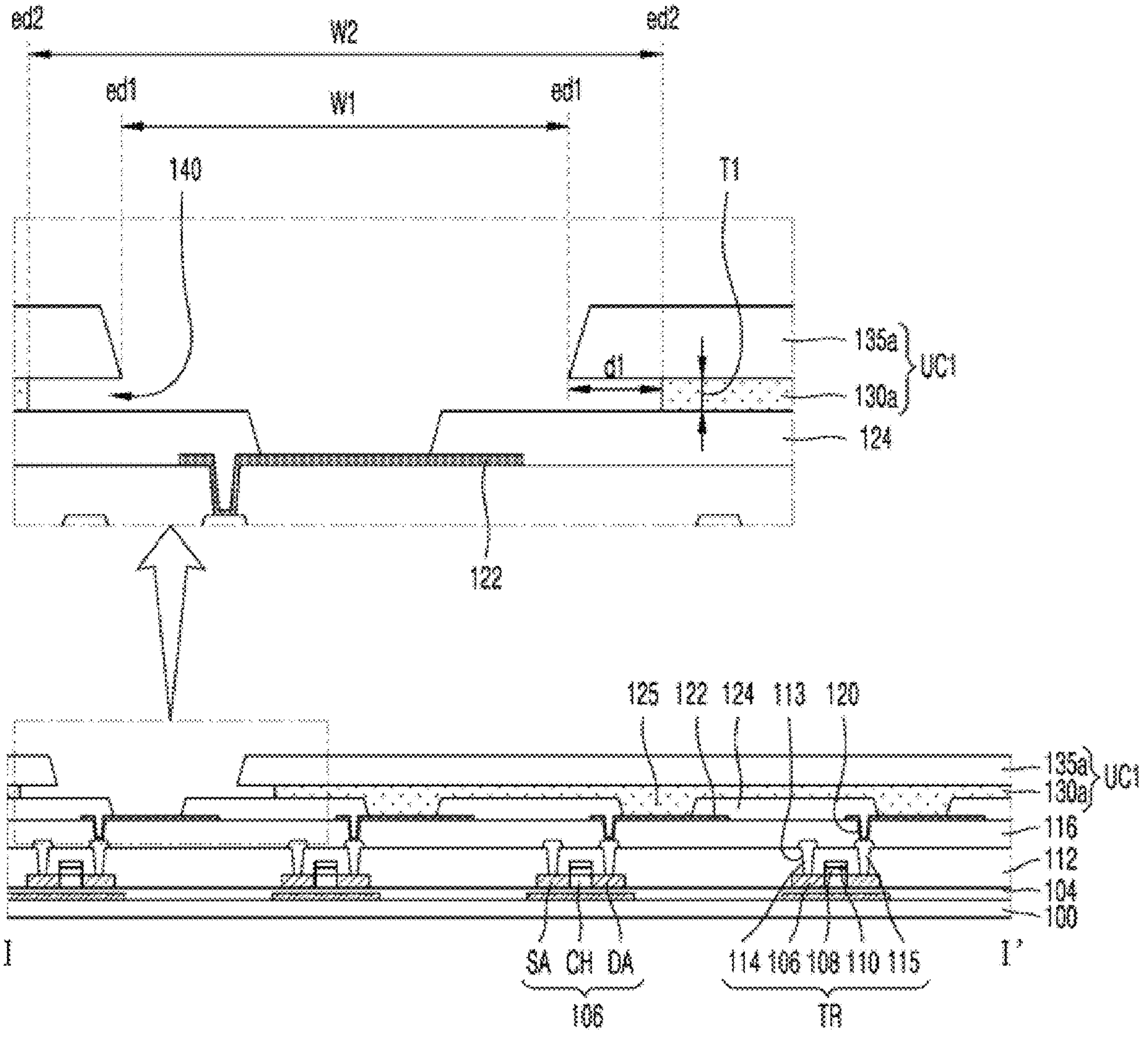
Figure 8:
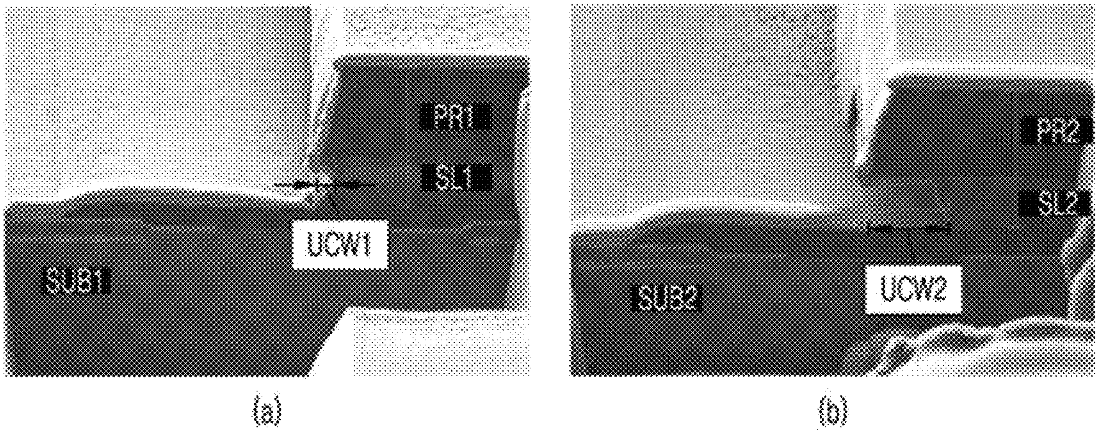

Referring to FIGS. 7 and 8, a first undercut structure UC1 is formed by performing a patterning process using the first photoresist pattern 135*a* as an etching mask. The first undercut structure UC1 is composed of a double layer, that is, a first protective layer pattern 130*a* and the first photoresist pattern 135*a*. As shown, a first undercut area 140 is defined by the first protective layer pattern 130*a*.

As shown, the first undercut structure UC1 has an undercut with respect to the first photoresist pattern 135*a*. The undercut refers to a portion of the first protective layer 130 below the first photoresist pattern 135*a* being additionally removed. In other words, the first undercut structure UC1 is formed by additionally and horizontally removing the first protective layer 130 by a first depth d1 inwardly of each of both opposing distal ends ed1 of the first photoresist pattern 135*a*. Accordingly, a second width W2 between both opposing distal ends ed2 of the first protective layer pattern 130*a* of the first undercut structure UC1 is larger than a first width W1 between both opposing distal ends ed1 of the first photoresist pattern 135*a* of the first undercut structure UC1.

The patterning process to form the first undercut structure UC1 can be performed in a lift-off scheme, for example. In more detail, the lift-off process can be performed using a fluorine (F)-based organic solvent composed of a polymer material containing a large amount of fluorine (F) in a functional group and carbon-carbon bonds continuously arranged in a chain structure. The fluorine (F)-based organic solvent containing a large amount of fluorine (F) at the functional group invades into the first protective layer 130 made of the fluoropolymer material containing a large amount of fluorine (F) at the functional group thereof. Then, the fluorine (F)-based organic solvent can selectively remove and pattern only the first protective layer 130 while not affecting the first photoresist pattern 135*a*.

In the patterning process using the lift-off scheme, an amount by which the first protective layer 130 is removed can be adjusted by controlling an exposure time of the first protective layer 130 made of the fluoropolymer material containing a large amount of fluorine (F) to the fluorine (F)-based organic solvent. Thus, the depth d1 of the first undercut area 140 of the first undercut structure UC1 can be controlled.

For example, FIG. 8 shows each of photographs showing each of undercut areas achieved by exposing each of protective layers SL1 and SL2 to fluorine (F)-based organic solvent for different time durations while each of the protective layers SL1 and SL2 and each of photoresist patterns PR1 and PR2 are disposed on each of substrates SUB1 and SUB2.

Referring to FIG. 8, when the protective layer SL1 is exposed to the fluorine (F)-based organic solvent for a first time duration of 10 seconds, a depth UCW1 of the undercut area formed in (a) of FIG. 8 is a first depth. When the protective layer SL2 is exposed thereto for 45 seconds as a second time duration which is relatively longer than the first time duration, a depth UCW2 of the undercut area formed in (b) of FIG. 8 is a second depth larger than the first depth. In other words, as the protective layer is exposed to the fluorine (F)-based organic solvent for a larger time duration, the depth of the undercut area is greater. Under the above characteristics of the protective layer, the first depth d1 of the first undercut area 140 of the first undercut structure UC1 has a larger size (d1> T1) than a thickness T1 of the first protective layer pattern 130*a*, as shown in FIG. 7.

Figure 9:
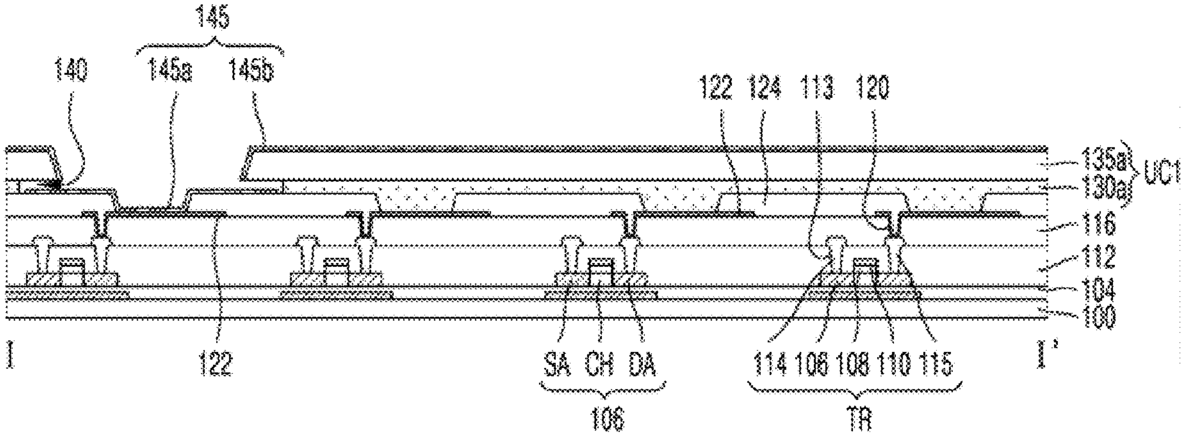

Referring to FIG. 9, the first organic light-emitting layer 145 including the first sub-pixel pattern 145*a* and a first organic material layer 145*b* is formed on the substrate 100. In more detail, first, plasma treatment is performed on the substrate 100 on which the first undercut area 140 has been formed. Plasma treatment removes foreign substances or residues produced during a previous process. In one example, plasma treatment can be performed using plasma into which a single gas or mixed gas of nitrogen ($N_2$), oxygen ($O_2$), or argon (Ar) is converted.

After the plasma treatment has been completed, the first organic light-emitting layer 145 is formed on the substrate 100. The first organic light-emitting layer 145 can be formed on an exposed surface of the first electrode 122 and a surface of the first photoresist pattern 135*a*.

The first sub-pixel pattern 145*a* can be disposed on the bank 124 and in the first undercut area 140 of the first undercut structure UC1. Accordingly, the first sub-pixel pattern 145*a* can extend conformally on and along a sidewall and a bottom of the bank hole 125 while covering an exposed surface of the first electrode 122. Further, the first sub-pixel pattern 145*a* can extend on along the top surface of the bank 124 and be formed on an exposed surface of the first photoresist pattern 135*a*.

Figure 10:
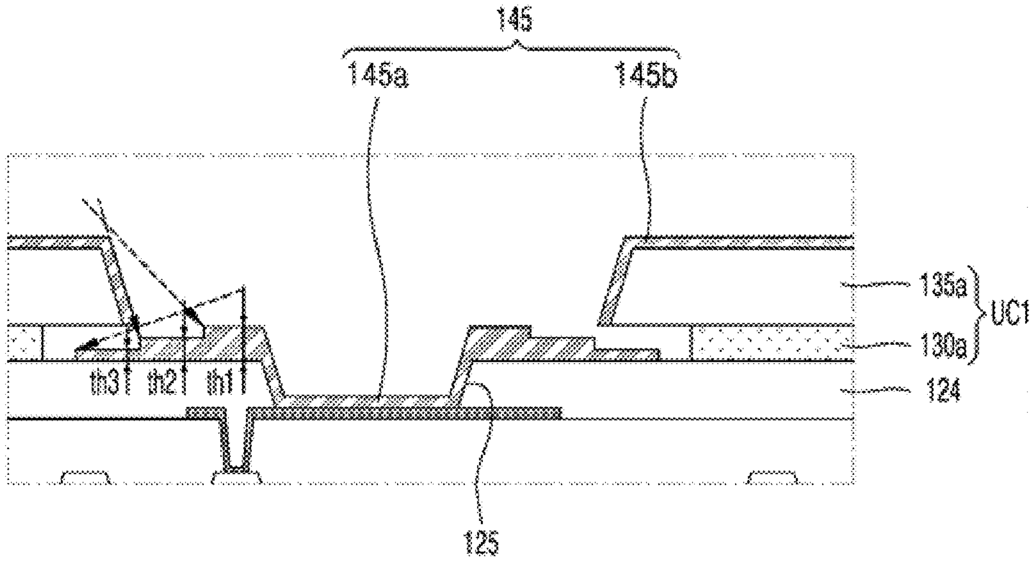

In one example, as shown in FIG. 10, the thickness of the first sub-pixel pattern 145*a* can increase step by step as the first sub-pixel pattern 145*a* extends toward the bank hole 125. Specifically, when a deposition process for forming the first organic light-emitting layer 145 is performed while the first undercut structure UC1 has been formed, the organic material can be non-uniformly deposited due to the first undercut structure UC1.

For example, as indicated by an arrow in FIG. 10, in the first undercut area 140 of the first undercut structure UC1, a relatively smaller amount of the organic material can be deposited due to the first photoresist pattern 135*a* located above the first undercut area 140. Thus, the smallest third thickness th3 can be achieved in the first undercut area 140. Further, as there is no structure disturbing the deposition process at a position closer to the bank hole 125, the largest first thickness th1 can be achieved at the position closer to the bank hole. As the organic material is accumulated on a distal end of the first photoresist pattern 135*a* at a position closer to the first undercut structure UC1, the second thickness th2 smaller than the first thickness th1 but larger than the third thickness th3 can be achieved at the position closer to the first undercut structure UC1.

In addition, the first organic light-emitting layer 145 may include a stack structure of a hole transport layer HTL, a light-emitting layer EML, and an electron transport layer ETL. Alternatively, the first organic light-emitting layer 145 may include a stack structure of a hole transport layer HTL, a light-emitting layer EML, an electron transport layer ETL, a hole blocking layer HBL, a hole injecting layer HIL, an electron blocking layer EBL, and an electron injecting layer EIL. The light-emitting layer EML of the first organic light-emitting layer 145 emits light via recombination of holes injected from the first electrode 122 and electrons injected from the second electrode to be formed later. In an example, the light-emitting layer EML can emit red light.

Figure 11:
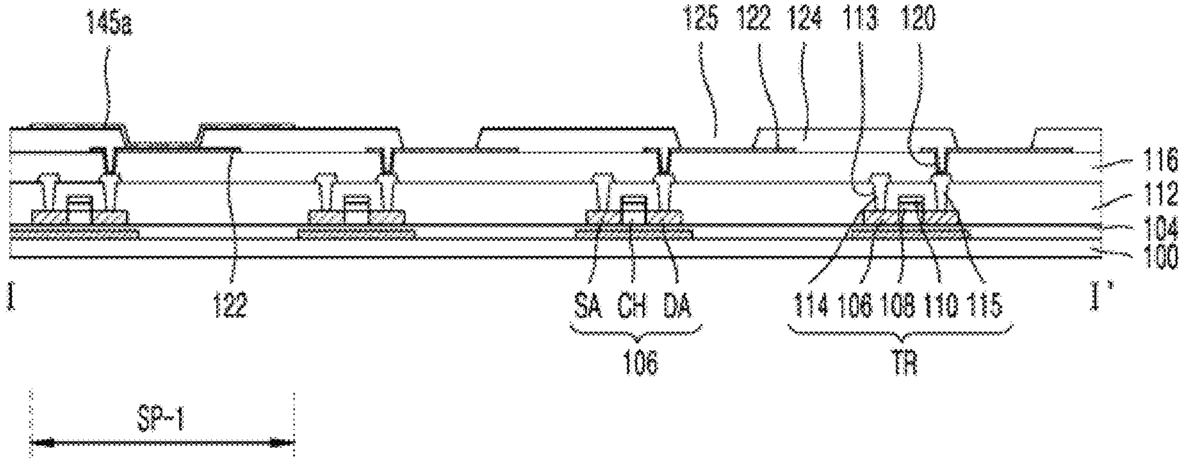

Referring to FIG. 11, a full lift-off process is performed to expose the first electrode 122 in an area other than the first sub-pixel pattern 145*a*. The full lift-off process can be performed using a fluorine (F)-based organic solvent. The fluorine (F)-based organic solvent invades into the first protective layer pattern 130*a* made of the polymer material containing a large amount of fluorine (F), and removes the first protective layer 130*a*. Then, the first photoresist pattern 135*a* disposed on the first protective layer pattern 130*a* and the first organic material layer 145*b* formed on a surface of the first photoresist pattern 135*a* are removed together while the first protective layer pattern 130*a* is removed.

In addition, the organic material constituting the first sub-pixel pattern 145*a* is resistant to the fluorine (F)-based organic solvent and does not deteriorate or change. Accordingly, the first sub-pixel pattern 145*a* is not damaged during the full lift-off process. When the above-described full lift-off process is performed, a surface of each of the first electrode 122 and the bank 124 in an area other than the first sub-pixel pattern 145*a* is exposed. An area in which the first sub-pixel pattern 145*a* is formed is defined as the first sub-pixel SP-1.

As shown in FIG. 3, the first sub-pixel pattern 145*a* has a rectangular shape including the outer portion BD and the inner trench portion TC disposed inwardly of the outer portion BD in a plan view. The outer portion BD of each of the first sub-pixel pattern has a shape in which inner, middle, and outer rings are arranged toward a sub-pixel pattern adjacent thereto in a plan view. Further, the inner, middle, and outer rings are arranged in a stepped manner such that the inner ring has the largest thickness and the outer ring has the smallest thickness.

Figure 12:
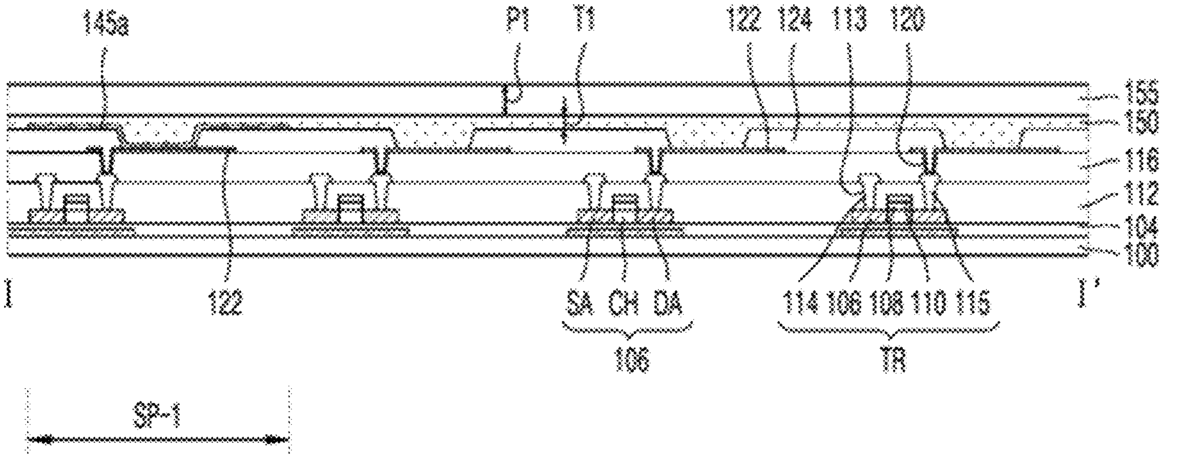

Referring to FIG. 12, a second protective layer 150 and a second photoresist layer 155 are sequentially formed on the entire surface of the substrate 100 on which the first sub-pixel pattern 145*a* has been formed. The second protective layer 150 is formed to have a thickness sufficient so as to cover an entirety of an exposed surface of the first sub-pixel pattern 145*a* to prevent damage to an organic light-emitting layer formed later. The second protective layer 150 can be made of the same material as that of the first protective layer (130 in FIG. 5) and have the same first thickness T1 as that thereof. In one example, the second protective layer 150 may be made of fluropolymer in which carbon-carbon bonds are continuously arranged in a chain structure so as to have orthogonality, and which contains a large amount of fluorine (F) at a functional group thereof. As described above, the orthogonality is a property in which two objects are not related to each other but exist independently of each other. Accordingly, the second protective layer 150 has both a hydrophobic characteristic of having a low affinity with water and an oleophobic characteristic of having a low affinity with oil. Under this orthogonality, the second protective layer 150 can be separated from moisture or reject the moisture. Further, the second protective layer 150 is less affected by a developer including an organic solvent used in a process step. Accordingly, damage to the second protective layer 150 caused by the organic solvent can be prevented.

The second photoresist layer 155 formed on the second protective layer 150 may be made of one of a positive type or negative type photoresist material. In an embodiment of the present disclosure, the second photoresist layer 155 is made of a positive type photoresist material and preferably has a first thickness P1. In this case, the second photoresist layer 155 can be prevented from being depressed downwardly or collapsing in a subsequent process of forming an undercut area.

Figure 13:
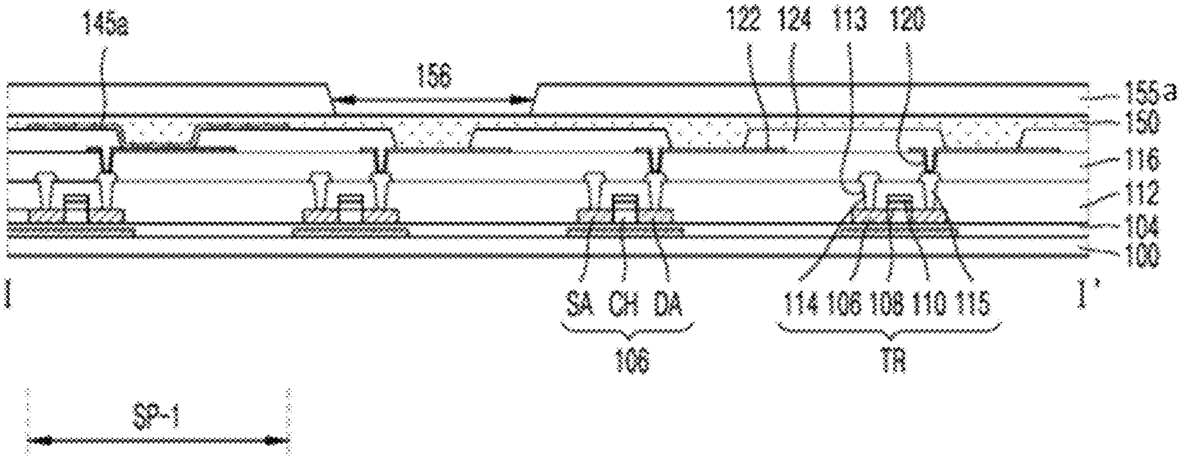

Referring to FIG. 13, a second photoresist pattern 155*a* including an opening area 156 defining an area where the second pixel pattern of the organic light-emitting layer is to be formed. A photomask having an opening defined therein at a position corresponding to the opening area 156 and exposing a portion of the second photoresist layer 155 is placed on the second photoresist layer. Light such as ultraviolet (UV) light is irradiated to the exposed portion of the second photoresist layer 155 exposed through the opening of the photomask. Next, a developing process of removing the second photoresist layer 155 is performed using a developer, such that only the portion of the second photoresist layer 155 exposed to ultraviolet (UV) light is selectively removed. The second photoresist pattern 155*a* is then formed which has the opening area 156 defined therein defining the area where the second sub-pixel pattern of the organic light-emitting layer is to be formed. A portion of a surface of the second protective layer 150 is exposed through the opening area 156 of the second photoresist pattern 155*a*.

Figure 14:
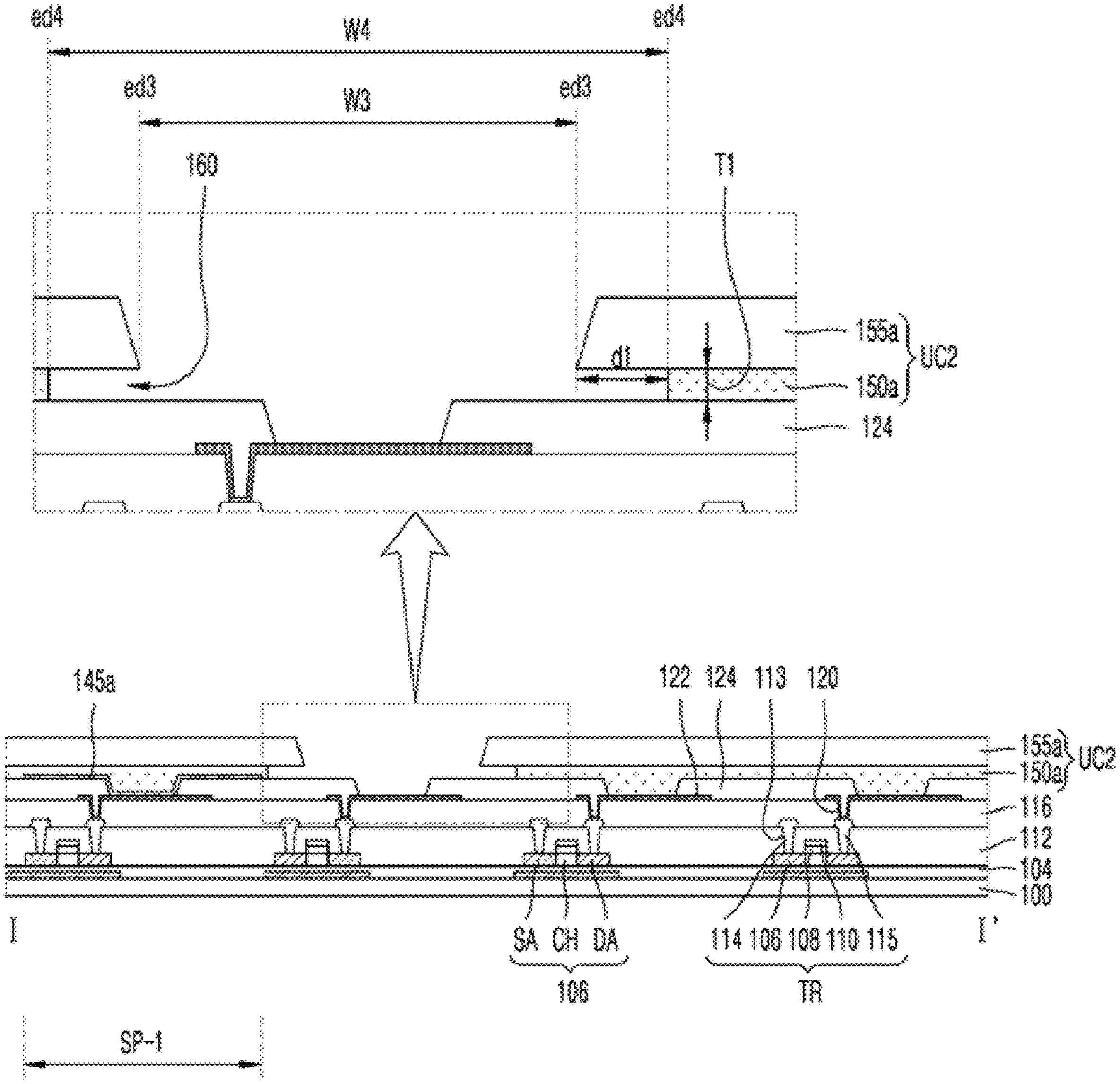

Referring to FIG. 14, a second undercut structure UC2 is formed by performing a patterning process using the second photoresist pattern 155*a* as an etching mask. The second undercut structure UC2 is composed of a double layer, that is, a second protective layer pattern 150*a* and the second photoresist pattern 155*a*. A second undercut area 160 is defined by the second protective layer pattern 150*a*.

The second undercut structure UC2 can have an undercut with respect to the second photoresist pattern 155*a*. As described above, the undercut refers to a portion of the second protective layer 150 below the second photoresist pattern 155*a* being additionally removed. In other words, the second undercut structure UC2 is formed by additionally and horizontally removing the second protective layer 150 by a predefined depth d1 inwardly of each of both opposing distal ends ed3 of the second photoresist pattern 155*a*. Accordingly, a fourth width W4 between both opposing distal ends ed4 of the second protective layer pattern 150*a* of the second undercut structure UC2 is larger than a third width W3 between both opposing distal ends ed3 of the second photoresist pattern 155*a* of the second undercut structure UC2.

The patterning process to form the second undercut structure UC2 can be performed in a lift-off scheme. The lift-off process can be performed using a fluorine (F)-based organic solvent. The fluorine (F)-based organic solvent may be composed of a polymer material which contains a large amount of fluorine (F) in a functional group and in which carbon-carbon bonds are continuously arranged in a chain structure. The fluorine (F)-based organic solvent containing a large amount of fluorine (F) at the functional group invades into the second protective layer 150 made of the fluoropolymer material containing a large amount of fluorine (F) at the functional group thereof. Then, the fluorine (F)-based organic solvent selectively removes and patterns only the second protective layer 150 while not affecting the second photoresist pattern 155*a*.

In the patterning process using the lift-off scheme, an amount by which the second protective layer 150 is removed can be adjusted by controlling an exposure time of the second protective layer 150 made of the fluoropolymer material containing a large amount of fluorine (F) to the fluorine (F)-based organic solvent. Thus, the depth d1 of the second undercut area 160 of the second undercut structure UC2 can be controlled. In one example, the depth d1 of the second undercut area 160 of the second undercut structure UC2 is equal to the depth of the first undercut area (140 in FIG. 7). Thus, the depth d1 of the second undercut area 160 of the second undercut structure UC2 has a larger size (d1>T1) than a thickness T1 of the second protective layer pattern 150*a*, as shown in FIG. 14.

Figure 15:
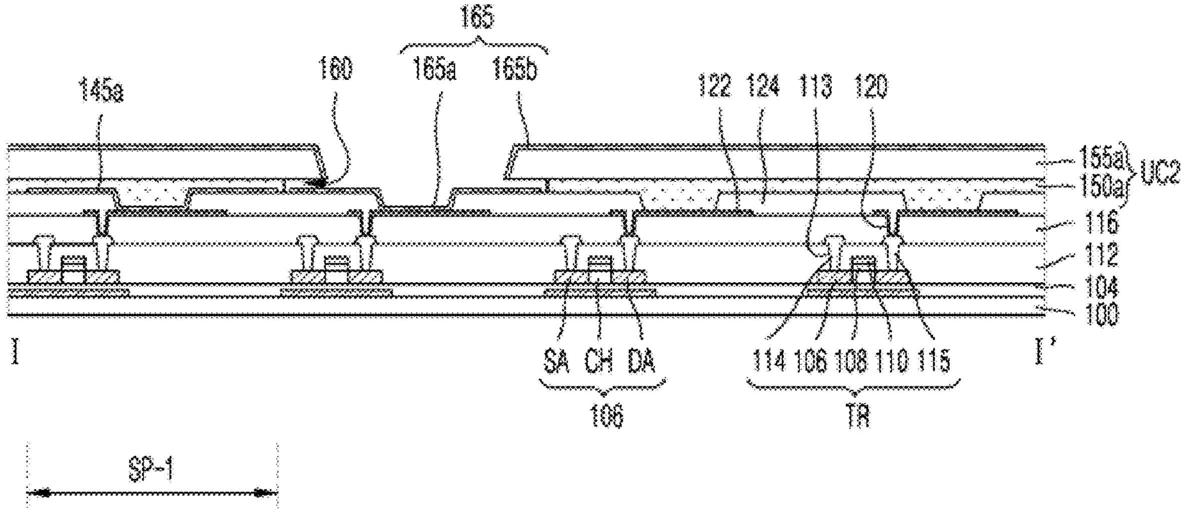

Referring to FIG. 15, a second organic light-emitting layer 165 including the second sub-pixel pattern 165*a* and a second organic material layer 165*b* is formed on the substrate 100. That is, second, a plasma treatment is performed on the substrate 100 on which the second undercut area 160 has been formed. The plasma treatment is used to remove foreign substances or residues produced during a previous process. In one example, plasma treatment can be performed using plasma into which a single gas or mixed gas of nitrogen ($N_2$), oxygen ($O_2$), or argon (Ar) is converted.

After the plasma treatment has been completed, the second organic light-emitting layer 165 is formed on the substrate 100. The second organic light-emitting layer 165 may be formed on an exposed surface of the first electrode 122 and a surface of the second photoresist pattern 155*a*.

The second sub-pixel pattern 165*a* is disposed on the bank 124 and in the second undercut area 160 of the second undercut structure UC2. Accordingly, the second sub-pixel pattern 165*a* extends conformally on and along a sidewall and a bottom of the bank hole 125 while covering an exposed surface of the first electrode 122. Further, the second sub-pixel pattern 165*a* extends on along the top surface of the bank 124. The second organic material layer 165*b* can be formed on an exposed surface of the second photoresist pattern 155*a*. In one example, as shown in FIG. 3, the thickness of the second sub-pixel pattern 165*a* increases step by step as the second sub-pixel pattern 165*a* extends toward the bank hole 125.

As shown in FIG. 3, the second sub-pixel pattern 165*a* can have a rectangular shape including the outer portion BD and the inner trench portion TC disposed inwardly of the outer portion BD in a plan view. The outer portion BD of each of the second sub-pixel pattern has a shape in which inner, middle, and outer rings are arranged toward a sub-pixel pattern adjacent thereto in a plan view. Further, the inner, middle, and outer rings are arranged in a stepped manner such that the inner ring has the largest thickness and the outer ring has the smallest thickness.

In addition, the second organic light-emitting layer 165 may include a stack structure of a hole transport layer HTL, a light-emitting layer EML, and an electron transport layer ETL. Alternatively, the second organic light-emitting layer 165 may include a stack structure of a hole transport layer HTL, a light-emitting layer EML, an electron transport layer ETL, a hole blocking layer HBL, a hole injecting layer HIL, an electron blocking layer EBL, and an electron injecting layer EIL. The light-emitting layer EML of the second organic light-emitting layer 165 emits light via recombination of holes injected from the first electrode 122 and electrons injected from the second electrode to be formed later. In an example, the light-emitting layer EML of the second organic light-emitting layer 165 may emit green light.

Figure 16:
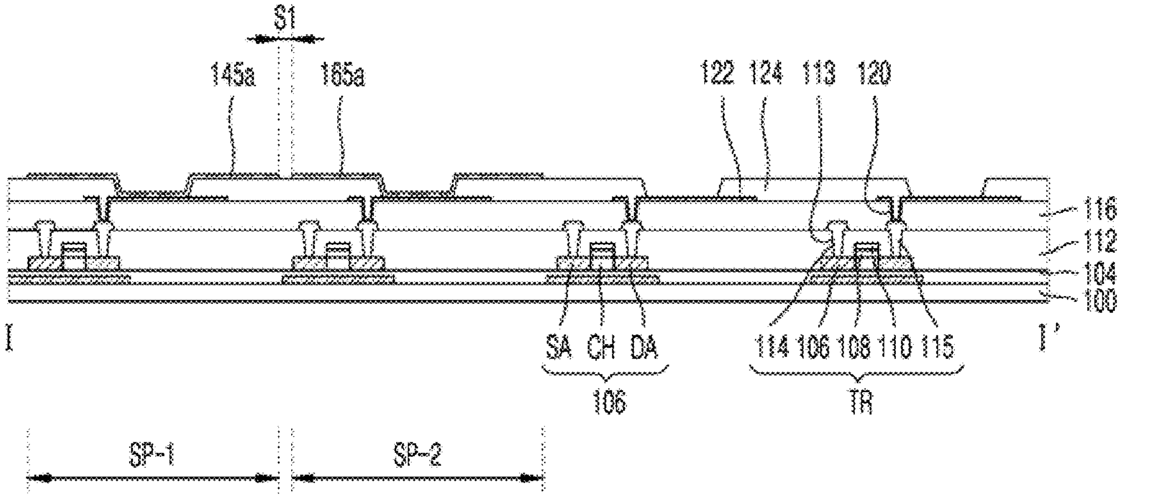

Referring to FIG. 16, a full lift-off process is performed to expose the first electrode 122 in an area other than the first sub-pixel pattern 145*a* and the second sub-pixel pattern 165*a*. The full lift-off process can be performed using a fluorine (F)-based organic solvent. The fluorine (F)-based organic solvent invades into the second protective layer pattern 150*a* made of the polymer material containing a large amount of fluorine (F), and removes the second protective layer pattern 150*a* from the bank 124 and the first electrode 122. Then, the second photoresist pattern 155*a* disposed on the second protective layer pattern 150*a* and the second organic material layer 165*b* formed on a surface of the second photoresist pattern 155*a* are removed together while the second protective layer pattern 150*a* is removed from the bank 124 and the first electrode 122.

Further, the organic material constituting each of the first sub-pixel pattern 145*a* and the second sub-pixel pattern 165*a* is resistant to the fluorine (F)-based organic solvent and does not deteriorate or change. Accordingly, the first sub-pixel pattern 145*a* and the second sub-pixel pattern 165*a* are not damaged during the full lift-off process. Further, the first sub-pixel pattern 145*a* and the second sub-pixel pattern 165*a* are spaced apart from each other by a predefined distance S1. An area in which the second sub-pixel pattern 165*a* is formed is defined as the second sub-pixel SP-2.

Figure 17:
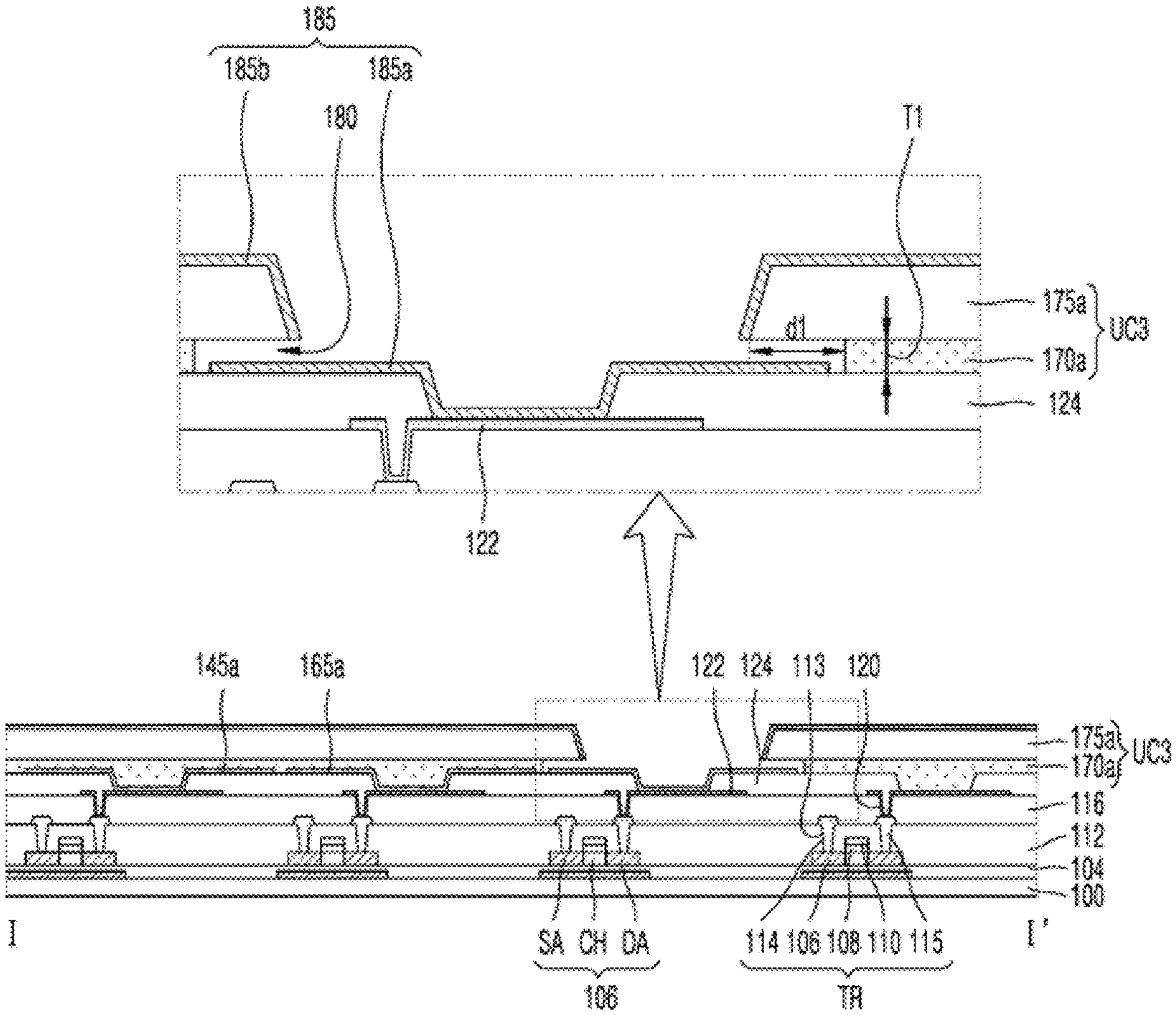

Next, as described above, the same process as the process for forming the undercut structure as performed to form the first sub-pixel pattern 145*a* or the second pixel pattern 165*a* can be performed to form a third undercut structure UC3. Specifically, a protective layer and a photoresist layer are formed on the substrate 100, and exposure and development processes are performed on the photoresist layer. As shown in FIG. 17, a third photoresist pattern 175*a* defines an area where the third sub-pixel pattern is to be formed. Then, a patterning process using the third photoresist pattern 175*a* as an etching mask is performed to form the third undercut structure UC3 composed of a double layer, that is, a third protective layer pattern 170*a* and the third photoresist pattern 175*a*. The third protective layer pattern 170*a* may be made of the same material as that of the first protective layer 130 or the second protective layer 150, for example, the polymer material containing a large amount of fluorine (F). Further, the third protective layer pattern 170*a* can be formed to have the same thickness T1 as that of the first protective layer 130 or the second protective layer 150. The third photoresist pattern 175*a* can also have the same thickness P1 as that of the first photoresist pattern 135*a* or the second photoresist pattern 155*a*.

Accordingly, the patterning process for forming the third undercut structure UC3 can be performed using a lift-off scheme using a fluorine (F)-based organic solvent. Also, the third undercut structure UC3 formed using this patterning process may be composed of a double layer, that is, the third protective layer pattern 170*a* and the third photoresist pattern 175*a*. A third undercut area 180 is defined by the third protective layer pattern 170*a*, and the depth d1 of the third undercut area 180 can have a larger size d1>T1 than the thickness T1 of the third protective layer pattern 170*a*.

Then, before forming the third organic light-emitting layer 185, plasma treatment is performed to remove foreign substances or residues. As shown in FIG. 17, a third organic light-emitting layer 185 is formed on the substrate 100 and includes the third sub-pixel pattern 185*a* formed on an exposed surface of the first electrode 122 and the third organic material layer 185*b* formed on a surface of the third photoresist pattern 175*a*.

The third sub-pixel pattern 185*a* is disposed on the bank 124 and in the third undercut area 180 of the third undercut structure UC3. Accordingly, the third sub-pixel pattern 185*a* extends conformally on and along a sidewall and a bottom of the bank hole 125 while covering an exposed surface of the first electrode 122. Further, the third sub-pixel pattern 185*a* extends on along the top surface of the bank 124. The third organic material layer 185*b* can be formed on an exposed surface of the third photoresist pattern 175*a*. In one example, as shown in FIG. 3, the thickness of the third sub-pixel pattern 185*a* increases step by step as the third sub-pixel pattern 185*a* extends toward the bank hole 125.

As shown in FIG. 3, the third sub-pixel pattern 185*a* has a rectangular shape including the outer portion BD and the inner trench portion TC disposed inwardly of the outer portion BD in a plan view. The outer portion BD of each of the third sub-pixel pattern has a shape in which inner, middle, and outer rings are arranged toward a sub-pixel pattern adjacent thereto in a plan view. Further, the inner, middle, and outer rings are arranged in a stepped manner such that the inner ring has the largest thickness and the outer ring has the smallest thickness.

As the thickness of the outer portion BD of each sub-pixel pattern 145*a*, 165*a*, and 185*a* decreases as the pattern extends outwardly, leakage current can be reduced. In one example, as the third thickness th3 at the outermost area of the outer portion BD has a small thickness sized such that electric charges do not travel through the outermost area of the outer portion BD, the leakage current can be reduced. Further, as the inner, middle, and outer rings of the outer portion BD of each sub-pixel pattern 145*a*, 165*a*, and 185*a* are arranged in a stepped manner in a plan view, the electrical resistance is rapidly increased between the rings. Further, this rapid increase is repeated, and therefore the leakage current can be reduced more effectively.

Further, the third organic light-emitting layer 185 may include a stack structure of a hole transport layer HTL, a light-emitting layer EML, and an electron transport layer ETL. Alternatively, the third organic light-emitting layer 185 may include a stack structure of a hole transport layer HTL, a light-emitting layer EML, an electron transport layer ETL, a hole blocking layer HBL, a hole injecting layer HIL, an electron blocking layer EBL, and an electron injecting layer EIL.

The light-emitting layer EML of the third organic light-emitting layer 185 emits light via recombination of holes injected from the first electrode 122 and electrons injected from the second electrode to be formed later. In an example, the light-emitting layer EML of the third organic light-emitting layer 185 may emit blue light.

Figure 18:
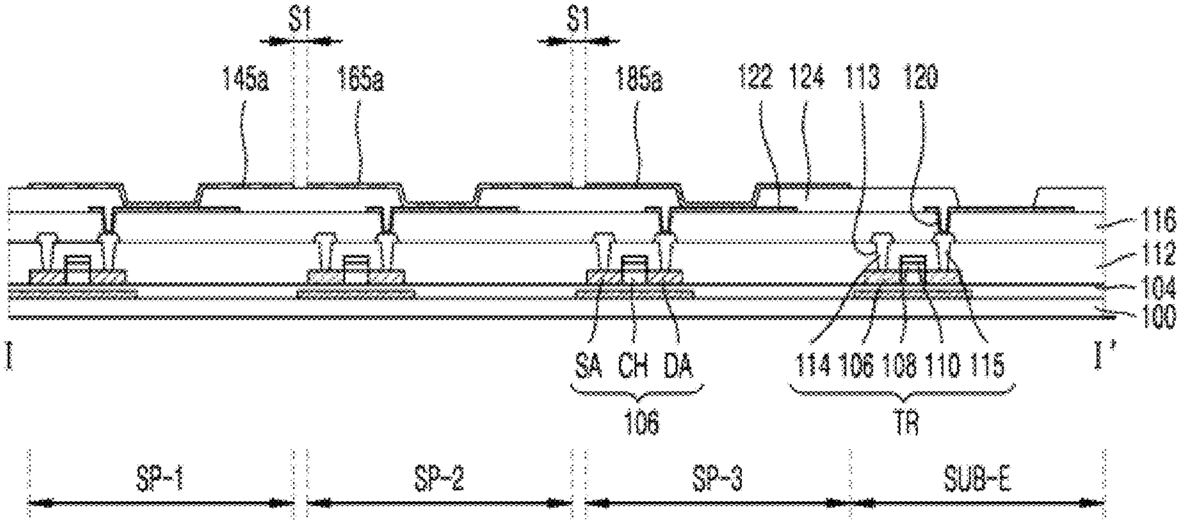

Referring to FIG. 18, the full lift-off process is performed on the substrate 100 on which the third sub-pixel pattern 185*a* has been formed. The full lift-off process is performed using a fluorine (F)-based organic solvent, and peels off the third protective layer pattern 170*a* from the bank 124 and the first electrode 122. Then, the third photoresist pattern 175*a* and the third organic material layer 185*b* disposed on the third protective layer pattern 170*a* are removed together while the third protective layer pattern 170*a* is peeled off and removed from the bank and the first electrode.

The organic material constituting each of the first sub-pixel pattern 145*a*, the second sub-pixel pattern 165*a* and the third sub-pixel pattern 185*a* is resistant to the fluorine (F)-based organic solvent, and thus does not deteriorate or change. Accordingly, the third sub-pixel pattern 185*a* is not damaged during the full lift-off process. Further, the organic material constituting each of the first sub-pixel pattern 145*a* and the second sub-pixel pattern 165*a* is not damaged during the full lift-off process.

Adjacent ones of the first sub-pixel pattern 145*a*, the second sub-pixel pattern 165*a*, and the third sub-pixel pattern 185*a* formed by performing the full lift-off process are spaced apart from each other by the predefined distance S1. An area in which the third sub-pixel pattern 185*a* is formed can be defined as the third sub-pixel SP-3. In addition, an area in which the sub-pixel patterns 145*a*, 165*a*, and 185*a* are not disposed but the first electrode 122 is exposed can be defined as the sub-pixel SUB_E for the auxiliary electrode.

Figure 19:
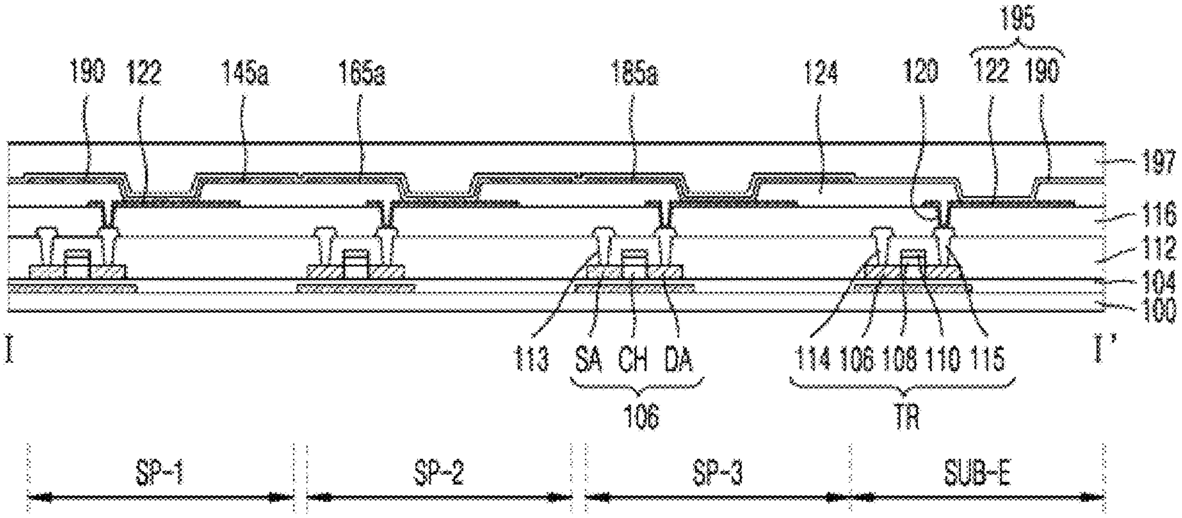

Referring to FIG. 19, the second electrode 190 is formed on the entire surface of the substrate 100. The second electrode 190 can function as a common electrode commonly contacting the first sub-pixel pattern 145*a*, the second sub-pixel pattern 165*a*, and the third sub-pixel pattern 185*a* and applying a voltage thereto. The second electrode 190 can also be referred to as a cathode electrode, and supplies electrons to each sub-pixel pattern 145*a*, 165*a*, and 185*a*.

The second electrode 190 may include a transparent metal material that transmits light therethrough. In one example, the second electrode 190 may be made of a transparent metal oxide such as indium-tin-oxide (ITO) or indium-zinc-oxide (IZO). Alternatively, the second electrode 190 may be made of a semi-transmissive metal material including at least one of molybdenum (Mo), tungsten (W), silver (Ag), or aluminum (Al) and an alloy thereof. Further, in the sub-pixel SUB_E for the auxiliary electrode, the second electrode 190 directly contacts the first electrode 122 such that a combination of the first and second electrodes constitute the auxiliary electrode 195. As described previously, the auxiliary electrode 195 serves to prevent unbalance of driving voltages.

In addition, the first sub-pixel pattern 145*a*, the second sub-pixel pattern 165*a*, the third sub-pixel pattern 185*a*, and the sub-pixel SUB_E for the auxiliary electrode 195 constitute one pixel. In addition, the pixel has a structure in which a plurality of sub-pixels are arranged in a matrix form. Accordingly, the sub-pixels SUB_E for the auxiliary electrode extend a mesh shape in a plan view.

The encapsulation layer 197 is formed on the substrate 100 on which the second electrode 190 has been formed. The encapsulation layer 197 blocks the invasion of moisture or oxygen from the outside to improve the reliability of the display device. Thus, the encapsulation layer 197 can include a single layer made of an inorganic or organic material, or a stack of inorganic and organic layers.

In the display device according to the first embodiment of the present disclosure, the patterning scheme using the undercut structure composed of the double layer, that is, the protective layer made of the fluoropolymer material containing a large amount of fluorine (F) and the photoresist pattern is used to produce the plurality of sub-pixel patterns. As the sub-pixel pattern is formed using the patterning scheme, the sub-pixel pattern can be finer than the sub-pixel pattern formed using the FMM. As sagging occurs in a central portion of the FMM due to thinness of the fine metal mask, the scheme using the FMM is applied to manufacture small and medium-sized panels, but is not applied to a large-area panel and has a limitation in forming a fine pattern. However, the patterning scheme can easily produce the plurality of sub-pixel patterns in a large-area panel.

Further, when the patterning scheme using the undercut structure composed of the double layer, that is, the protective layer made of the fluoropolymer material containing a large amount of fluorine (F) and the photoresist pattern is used, damage to the organic material constituting the sub-pixel pattern can be prevented, thereby improving the performance and reliability of the display device.

In addition, as the thickness of the outer portion of each sub-pixel pattern decreases as the pattern extends outwardly, leakage current may be reduced. Further, as the inner, middle, and outer rings of the outer portion of each sub-pixel pattern are arranged in a stepped manner in a plan view, electrical resistance is rapidly increased between the rings. Further, this rapid increase is repeated. Thus, the leakage current may be reduced more effectively.

Further, the undercut structure composed of the double layer, that is, the protective layer made of the fluoropolymer material containing a large amount of fluorine (F) and the photoresist pattern, is introduced, and the depth of the undercut area is adjusted, thereby controlling a shape of the sub-pixel pattern. Hereinafter, descriptions will be made with reference to the drawings.

In particular, FIGS. 20 to 27 are diagrams illustrating a method for manufacturing a display device according to a second embodiment of the present disclosure. In addition, FIGS. 28A to 28C are diagrams illustrating defects occurring in adjustment of a depth of an undercut area in the second embodiment of the present disclosure. The same reference numerals are used for the same or similar components as in FIGS. 4 to 19.

Figure 20:
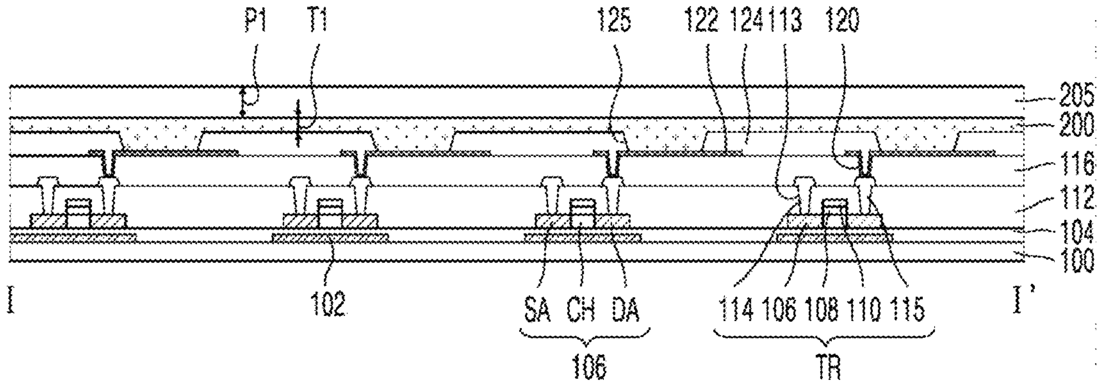
FIGS. 20 to 27 are diagrams illustrating an organic light-emitting display device according to a second embodiment of the present disclosure.

Referring to FIG. 20, the light-blocking layer 102, the buffer layer 104, the thin-film transistor TR, the interlayer insulating film 112, the source electrode 114, the drain electrode 115, the planarization film 116, the first electrode 122, and the bank 124 are disposed on the substrate 100. The light-blocking layer 102 is disposed on the substrate 100 so as to overlap the thin-film transistor TR, and the buffer layer 104 covering the light-blocking layer 102 is formed. The thin-film transistor TR is disposed on the buffer layer 104 and includes the active area 106, the gate electrode 110, the source electrode 114, and the drain electrode 115.

The gate electrode 110 is disposed on the active area 106 while the gate insulating film 108 is interposed therebetween. In addition, the source electrode 114 and the drain electrode 115 are in direct contact with the source area SA and the drain area DA of the active area 106, respectively. However, the present disclosure is not limited thereto.

As shown, the interlayer insulating film 112 covers an entirety of each of the active area 106 and the gate electrode 110, and includes the first contact holes 113 exposing a portion of a surface of the active area 106. The source electrode 114 and the drain electrode 115 are in contact with the source area SA and the drain area DA, respectively, via the first contact holes 113. Further, the source electrode 114 and the drain electrode 115 are spaced apart from each other while the gate electrode 110 is interposed therebetween. Each of the source electrode 114 and the drain electrode 115 fill an entirety of each of the first contact holes 113 defined in the interlayer insulating film 112, and cover a portion of the top surface of the interlayer insulating film 112.

The planarization film 116 including the second contact hole 120 exposing a portion of a surface of the drain electrode 115 is disposed on the interlayer insulating film 112. The first electrode 122 is disposed on the planarization film 116 and contacts the drain electrode 115 exposed through the second contact hole 120 and thus is electrically connected to the gate electrode 110. The first electrode 122 can also be referred to as an anode electrode or a pixel electrode. The first electrode 122 is also divided into portions corresponding to a plurality of sub-pixels SP-1, SP-2, and SP-3, respectively.

The plurality of banks 124 are disposed on the planarization film 116 and define light-emitting areas of the sub-pixels SP-1, SP-2, and SP-3, respectively. That is, the bank 124 defines each sub-pixel SP-1, SP-2, and SP-3. As shown, the bank 124 is divided into portions spaced apart from each other, and the divided portions of the first electrode 122 are spaced from each other via each of the divided portions of the bank such that the divided portions of the first electrode correspond to the plurality of sub-pixels SP-1, SP-2, and SP-3, respectively.

Also, a first protective layer 200 and a first photoresist layer 205 are formed on the entire surface of the substrate 100 on which the above-described structure has been formed. The first protective layer 205 fills an entirety of the bank hole 125 and has a first thickness T1 on an upper surface of the bank 124. The first protective layer 200 may be made of fluropolymer in which carbon-carbon bonds are continuously arranged in a chain structure so as to have orthogonality, and which contains a large amount of fluorine (F) at a functional group thereof. The orthogonality indicates two objects are not related to each other but exist independently of each other. Accordingly, the first protective layer 200 can have both of a hydrophobic characteristic of having a low affinity with water and an oleophobic characteristic of having a low affinity with oil. Under this orthogonality, the first protective layer 200 can be separated from moisture or reject the moisture. Further, the first protective layer 200 is less affected by a developer including an organic solvent used in a process step. Accordingly, damage to the first protective layer 200 caused by the organic solvent can be prevented.

The first photoresist layer 205 formed on the first protective layer 200 may be made of one of a positive type or negative type photoresist material. In an embodiment of the present disclosure, the first photoresist layer 205 may be made of a positive type photoresist material. The first photoresist layer 205 preferably has a first thickness P1 and can be prevented from being depressed downwardly or collapsing in a subsequent process of forming an undercut area.

Figure 21:
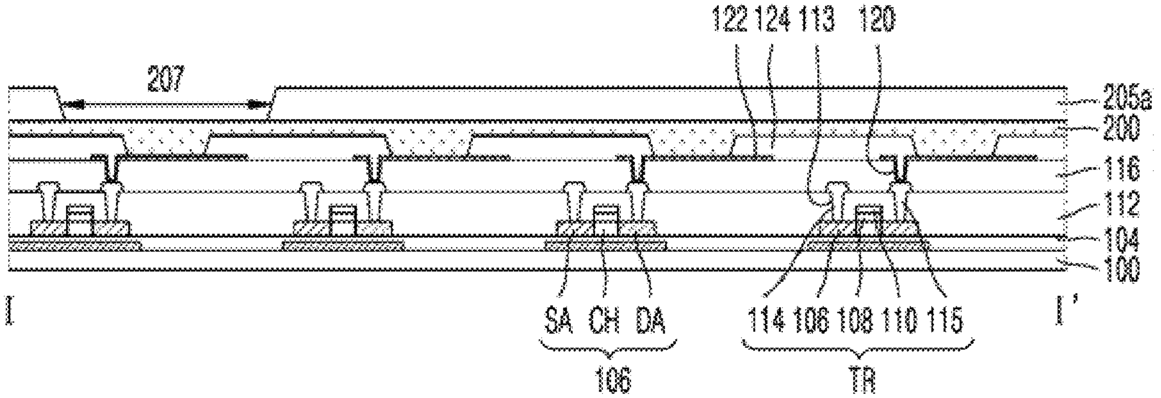

Referring to FIG. 21, a first photoresist pattern 205*a* including an opening area 207 defining an area for the first pixel pattern of the organic light-emitting layer is formed. For example, a photomask having an opening defined therein at a position corresponding to the opening area 207 and exposing a portion of the first photoresist layer 205 is placed on the first photoresist layer. Light such as ultraviolet (UV) light is irradiated to the exposed portion of the photoresist layer 205 exposed through the opening of the photomask. Next, a developing process of removing the photoresist layer 205 is performed using a developer, such that only the portion of the photoresist layer 205 exposed to UV light is selectively removed. The first photoresist pattern 205*a* is then formed which has the opening area 207 defining the area where the first sub-pixel pattern of the organic light-emitting layer is to be formed. A portion of a surface of the first protective layer 200 is exposed through the opening area 207 of the first photoresist pattern 205*a*.

Figure 22:
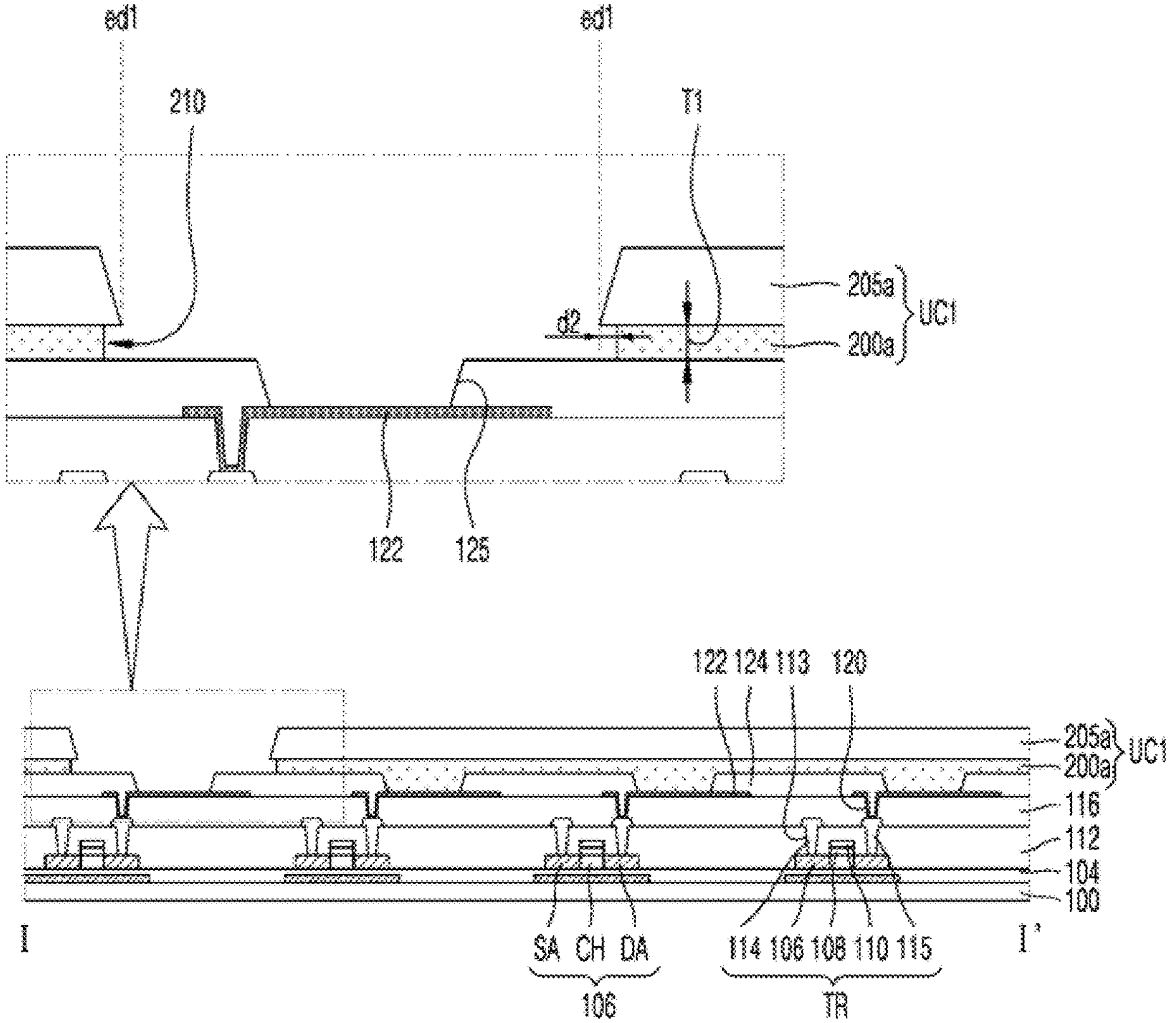

Referring to FIG. 22, the first undercut structure UC1 is formed by performing a patterning process using the first photoresist pattern 205*a* as an etching mask. The first undercut structure UC1 includes a double layer, that is, the first protective layer pattern 200*a* and the first photoresist pattern 205*a*. A first undercut area 210 is defined by the first protective layer pattern 200*a*.

The first undercut structure UC1 includes an undercut with respect to the first photoresist pattern 205*a*. In particular, the undercut refers to a portion of the first protective layer 200 below the first photoresist pattern 205*a* being additionally removed. In other words, the first undercut structure UC1 is formed by additionally and horizontally removing the first protective layer 200 by a depth d2 inwardly of each of both opposing distal ends "ed1" of the first photoresist pattern 205*a*.

The patterning process to form the first undercut structure UC1 can be performed in a lift-off scheme. The lift-off process can be performed using a fluorine (F)-based organic solvent composed of a polymer material which contains a large amount of fluorine (F) in a functional group and in which carbon-carbon bonds are continuously arranged in a chain structure. The fluorine (F)-based organic solvent containing a large amount of fluorine (F) at the functional group invades into the first protective layer (200 in FIG. 21) made of the fluoropolymer material containing a large amount of fluorine (F) at the functional group thereof. Then, the fluorine (F)-based organic solvent selectively removes and patterns only the first protective layer 200 while not affecting the first photoresist pattern 205*a*.

In the patterning process using the lift-off scheme, an amount by which the first protective layer 200 is removed can be adjusted by controlling an exposure time of the first protective layer 200 made of the fluoropolymer material containing a large amount of fluorine (F) to the fluorine (F)-based organic solvent. Thus, a depth d2 of the first undercut area 140 of the first undercut structure UC1 can be controlled. The depth d2 of the first undercut area 210 according to the second embodiment of the present disclosure has a size d2 smaller than a thickness T1 of the first protective layer pattern 200*a* (d2<T1).

Figure 23:
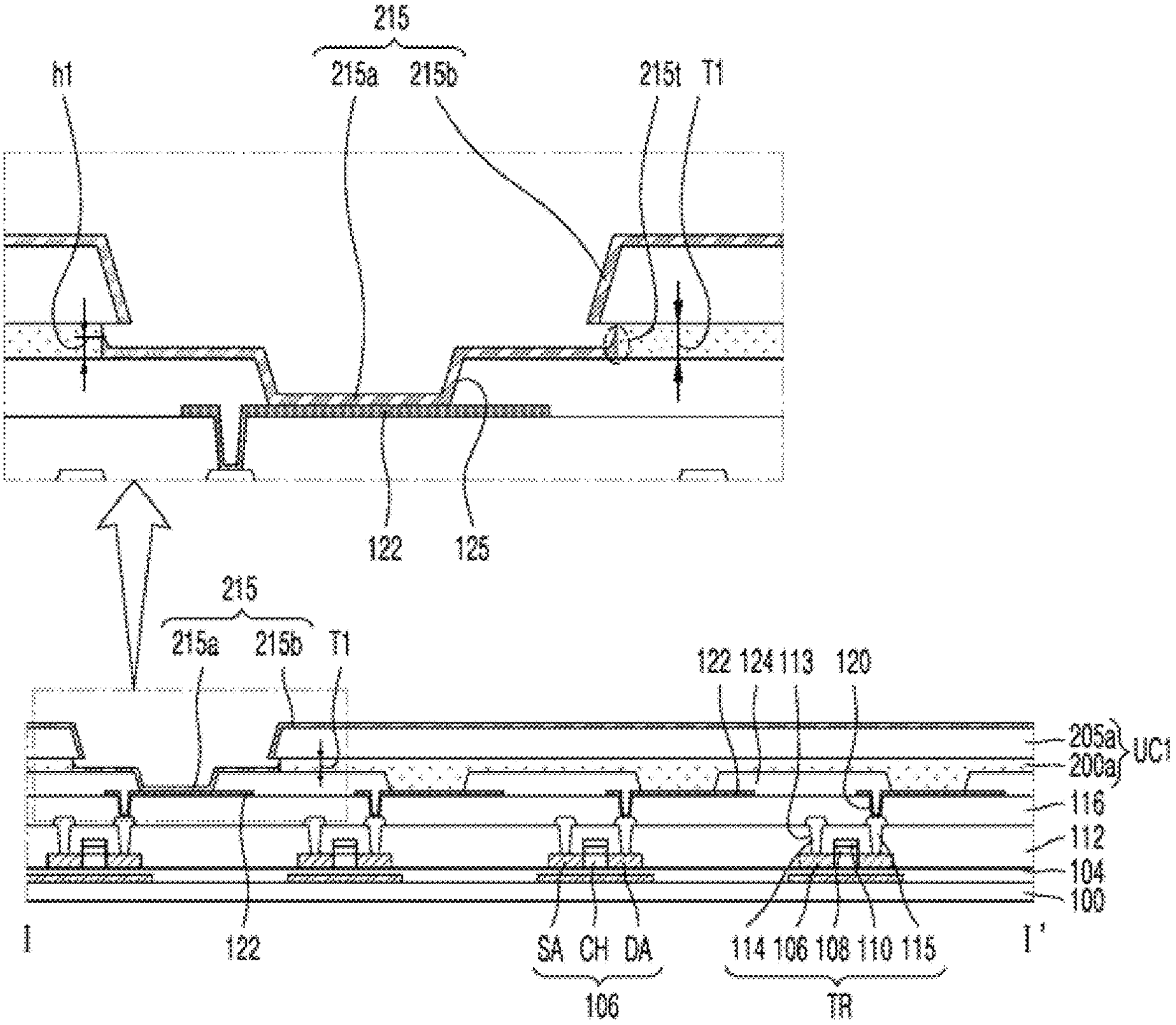

Referring to FIG. 23, a first organic light-emitting layer 215 including a first sub-pixel pattern 215*a* and a first organic material layer 215*b* is formed on the substrate 100. That is, first, plasma treatment is performed on the substrate 100 on which the first undercut area 210 has been formed. Plasma treatment removes foreign substances or residues produced during a previous process. In one example, plasma treatment can be performed using plasma into which a single gas or mixed gas of nitrogen ($N_2$), oxygen ($O_2$), or argon (Ar) is converted.

After the plasma treatment has been completed, the first organic light-emitting layer 215 is formed on the substrate 100. The first organic light-emitting layer 215 can be formed on an exposed surface of the first electrode 122 and a surface of the first photoresist pattern 205*a* in a deposition manner.

The first sub-pixel pattern 215*a* is disposed on the bank 124 and in the first undercut area 210 of the first undercut structure UC1. Further, the depth d2 of the first undercut area 210 according to the second embodiment of the present disclosure has a size d2<T1 smaller than the thickness T1 of the first protective layer pattern 200*a*.

Accordingly, the first sub-pixel pattern 215*a* extends conformally on and along a sidewall and a bottom of the bank hole 125 while covering an exposed surface of the first electrode 122. Further, the first sub-pixel pattern 215*a* extends on along the top surface of the bank 124. The first organic material layer 215*b* is formed on an exposed surface of the first photoresist pattern 205*a*. Because the depth d2 of the first undercut area 210 according to the second embodiment of the present disclosure has a size d2 smaller than the thickness T1 of the first protective layer pattern 200*a* (d2<T1), the first sub-pixel pattern 215*a* extends to each of both opposing exposed sidewall surfaces of the first protective layer pattern 200*a* such that a tail 215*t* is formed. The tail 215*t* is included in the first sub-pixel pattern 215*a* and is located at each of both opposing distal ends of the first sub-pixel pattern 215*a* in a cross sectional view, whereas the tail 215*t* is formed to surround the outer portion BD as shown in FIG. 3 in a plan view.

The tail 215*t* defines an area in which the first sub-pixel pattern 215*a* is formed in a plan view. The tail 215*t* thus can function as an alignment mark for the first sub-pixel pattern

215*a* in a subsequent process. For example, when a color filter is formed on the first sub-pixel pattern 215*a*, a color filter formation area corresponding to the first sub-pixel pattern 215*a* can be aligned using the tail 215*t.*

A vertical dimension h1 of the tail 215*t* of the first sub-pixel pattern 215*a* can have a thickness smaller than the thickness T1 of the first protective layer pattern 200*a*. Thus, a portion of each of both opposing sidewall surfaces of the first protective layer pattern 200*a* can be exposed. Further, the first organic material layer 215*b* is formed on the exposed surface of the first photoresist pattern 205*a*.

In addition, the first organic light-emitting layer 215 may include a stack structure of a hole transport layer HTL, a light-emitting layer EML, and an electron transport layer ETL. Alternatively, the first organic light-emitting layer 215 may include a stack structure of a hole transport layer HTL, a light-emitting layer EML, an electron transport layer ETL, a hole blocking layer HBL, a hole injecting layer HIL, an electron blocking layer EBL, and an electron injecting layer EIL. The light-emitting layer EML of the first organic light-emitting layer 215 emits light via recombination of holes injected from the first electrode 122 and electrons injected from the second electrode to be formed later. In an example, the light-emitting layer EML may emit red light.

Figure 24:
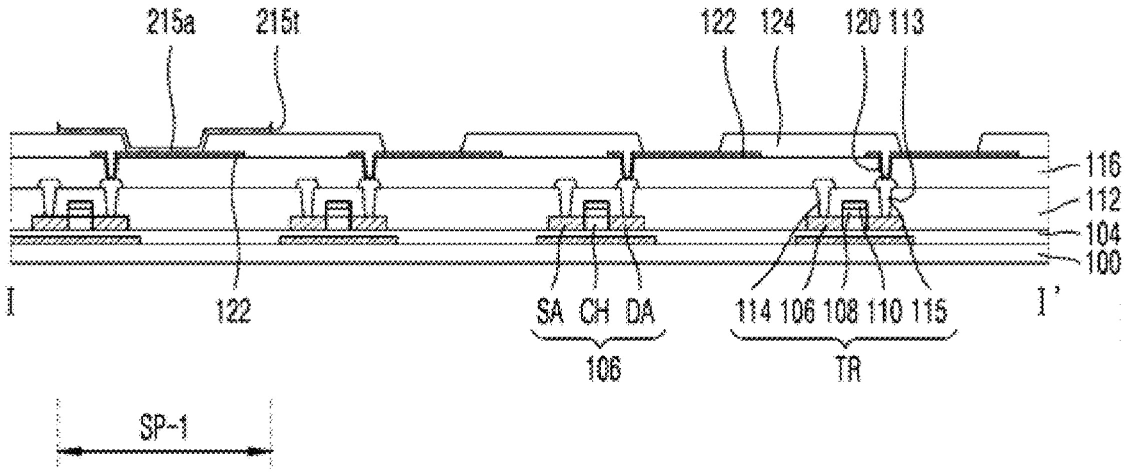

Referring to FIG. 24, a full lift-off process is performed to expose the first electrode 122 in an area other than the first sub-pixel pattern 215*a*. The full lift-off process can be performed using a fluorine (F)-based organic solvent. The fluorine (F)-based organic solvent invades into the first protective layer pattern 200*a* made of the polymer material containing a large amount of fluorine (F), and removes the first protective layer pattern 200*a*. Then, the first photoresist pattern 205*a* disposed on the first protective layer pattern 200*a* and the first organic material layer 215*b* formed on a surface of the first photoresist pattern 205*a* are removed together while the first protective layer pattern 200*a* is removed.

Further, the organic material constituting the first sub-pixel pattern 215*a* is resistant to the fluorine (F)-based organic solvent and does not deteriorate or change. Accordingly, the first sub-pixel pattern 215*a* is not damaged during the full lift-off process. When the above-described full lift-off process is performed, a surface of each of the first electrode 122 and the bank 124 in an area other than the first sub-pixel pattern 215*a* is exposed. An area in which the first sub-pixel pattern 215*a* is formed can be defined as the first sub-pixel SP-1.

Figure 25:
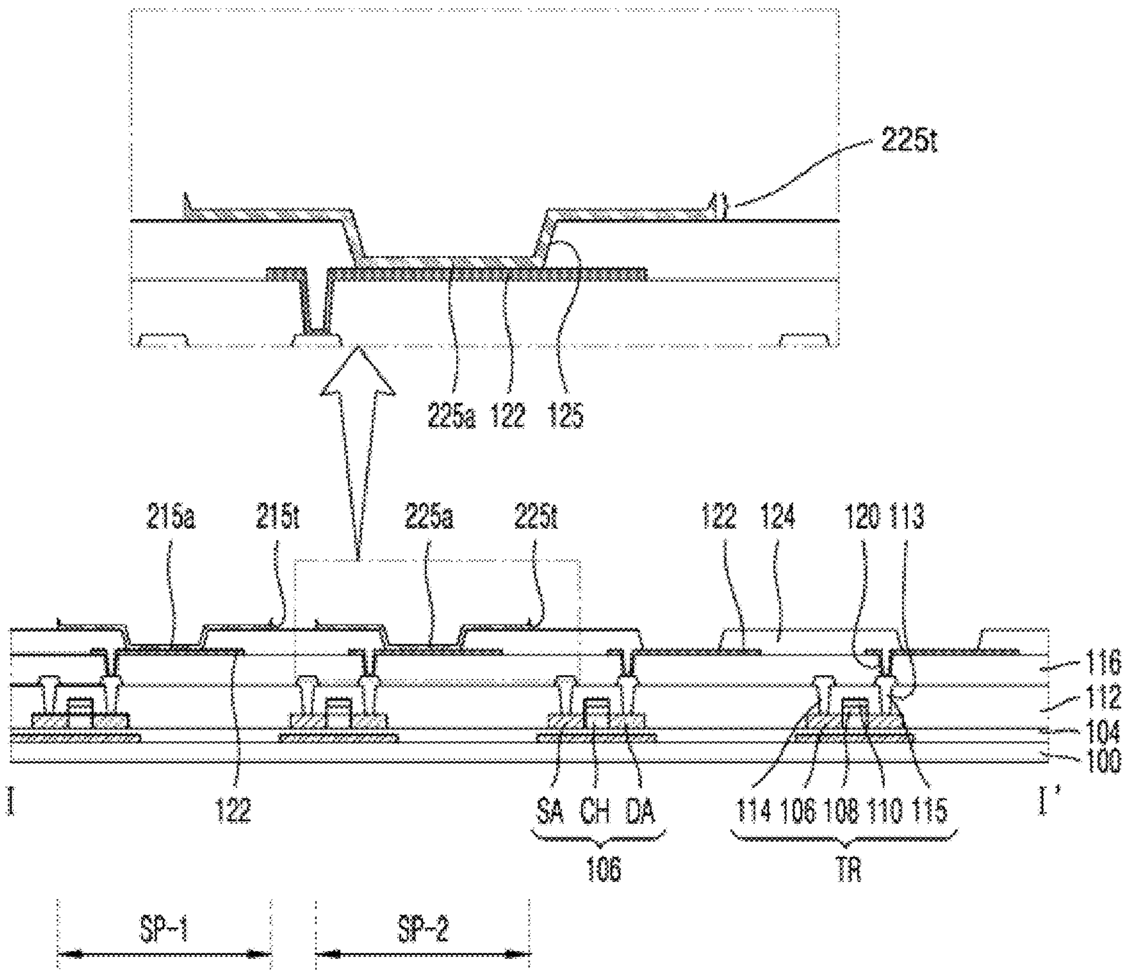

Next, processes of forming a second undercut structure in the second sub-pixel SP-2 are performed in the same manner as that described in FIGS. 20 to 24. Then, a second sub-pixel pattern 225*a* is formed using the formed undercut structure, as shown in FIG. 25. A depth of an undercut area of the second undercut structure according to the second embodiment of the present disclosure has a size smaller than a thickness of a second protective layer pattern as a portion of the second undercut structure. Thus, the second sub-pixel pattern 225*a* includes a tail 225*t* at each of both opposing distal ends thereof. Further, the tail 225*t* is located at each of both opposing distal ends of the second sub-pixel pattern 225*a* in a cross sectional view, whereas the tail 225*t* is formed to surround the outer portion BD thereof as shown in FIG. 3 in a plan view. In an embodiment of the present disclosure, the second sub-pixel pattern 225*a* may emit green light.

The tail 225*t* defines an area in which the second sub-pixel pattern 225*a* is formed in a plan view. The tail 225*t* can function as an alignment mark for the second sub-pixel pattern 225*a* in a subsequent process. For example, when a color filter is formed on the second sub-pixel pattern 225*a*, a color filter formation area corresponding to the second sub-pixel pattern 225*a* can be aligned using the tail 225*t*.

Figure 26:
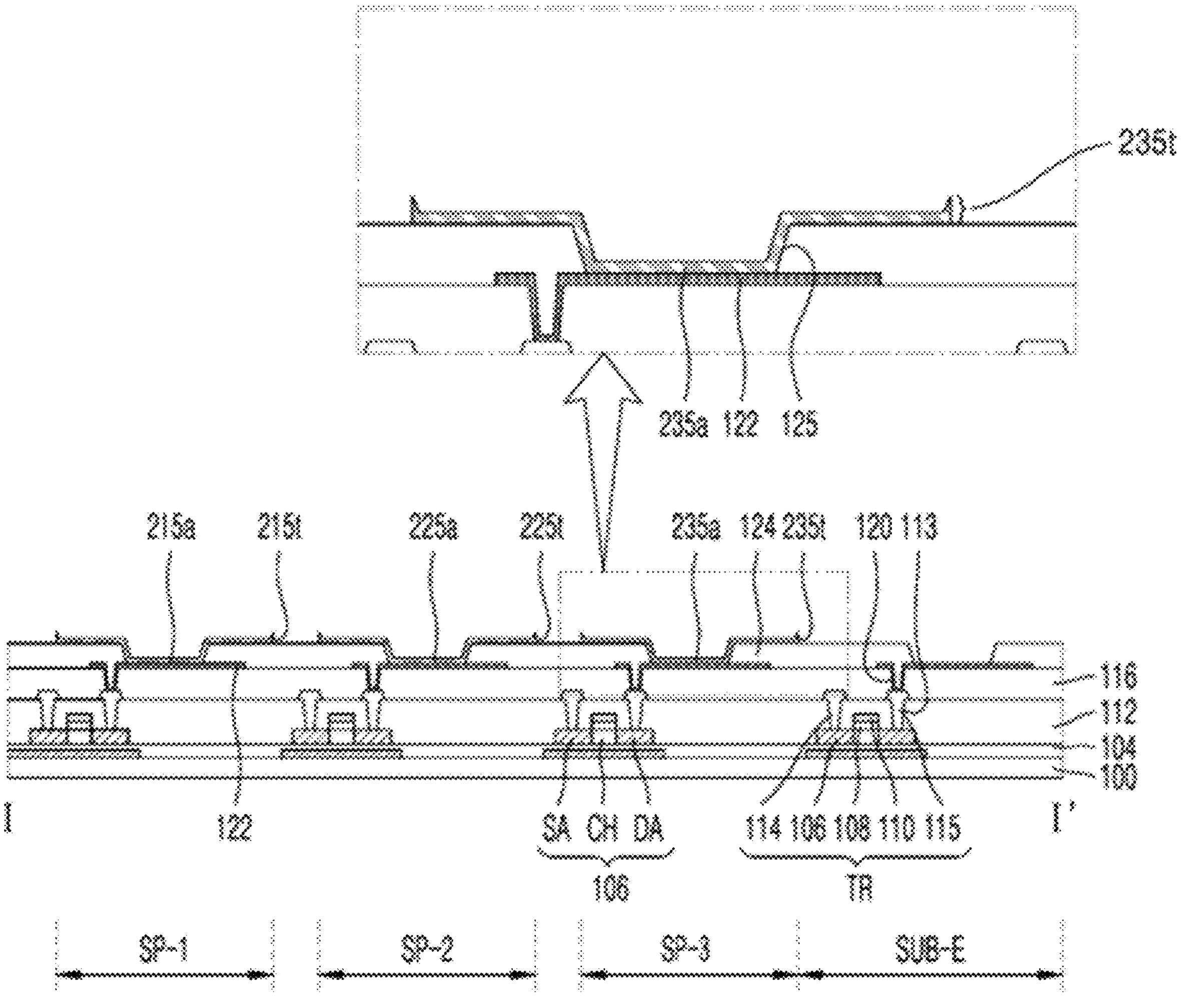

Subsequently, processes of forming a third undercut structure in the third sub-pixel SP-3 are performed in the same manner as that described in FIGS. 20 to 24. Then, a third sub-pixel pattern 235*a* is formed using the formed undercut structure, as shown in FIG. 26. Further, a depth of an undercut area of the third undercut structure according to the second embodiment of the present disclosure can have a size smaller than a thickness of a third protective layer pattern as a portion of the third undercut structure. Thus, the third sub-pixel pattern 235*a* can include a tail 235*t* at each of both opposing distal ends thereof. Further, the tail 235*t* is located at each of both opposing distal ends of the third sub-pixel pattern 235*a* in a cross sectional view, whereas the tail 235*t* is formed to surround the outer portion BD thereof as shown in FIG. 3 in a plan view. In an embodiment of the present disclosure, the third sub-pixel pattern 235*a* may emit blue light.

The tail 235*t* defines an area in which the third sub-pixel pattern 235*a* is formed in a plan view. In addition, the tail 235*t* acts as an alignment mark for the third sub-pixel pattern 235*a* in a subsequent process. For example, when a color filter is formed on the third sub-pixel pattern 235*a*, a color filter formation area corresponding to the third sub-pixel pattern 235*a* can be aligned using the tail 235*t*. Each of the tails 225*t* and 235*t* formed at each of both opposing distal ends of each of the second sub-pixel pattern 225*a* and the third sub-pixel pattern 235*a* have the same vertical dimension as the vertical dimension h1 of the tail 215*t* of the first sub-pixel pattern (215*a* in FIG. 23).

Figure 27:
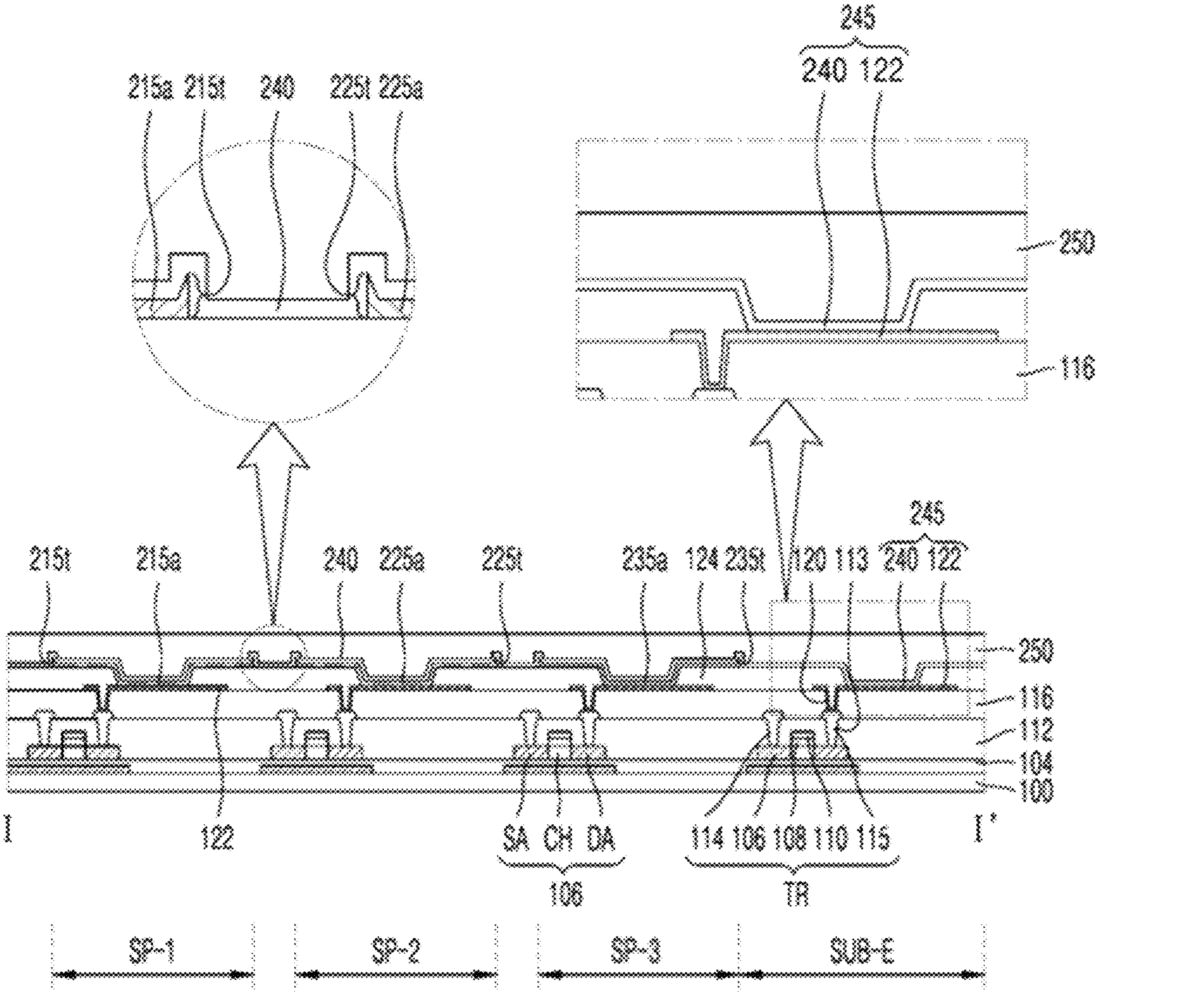
Figure 28A:
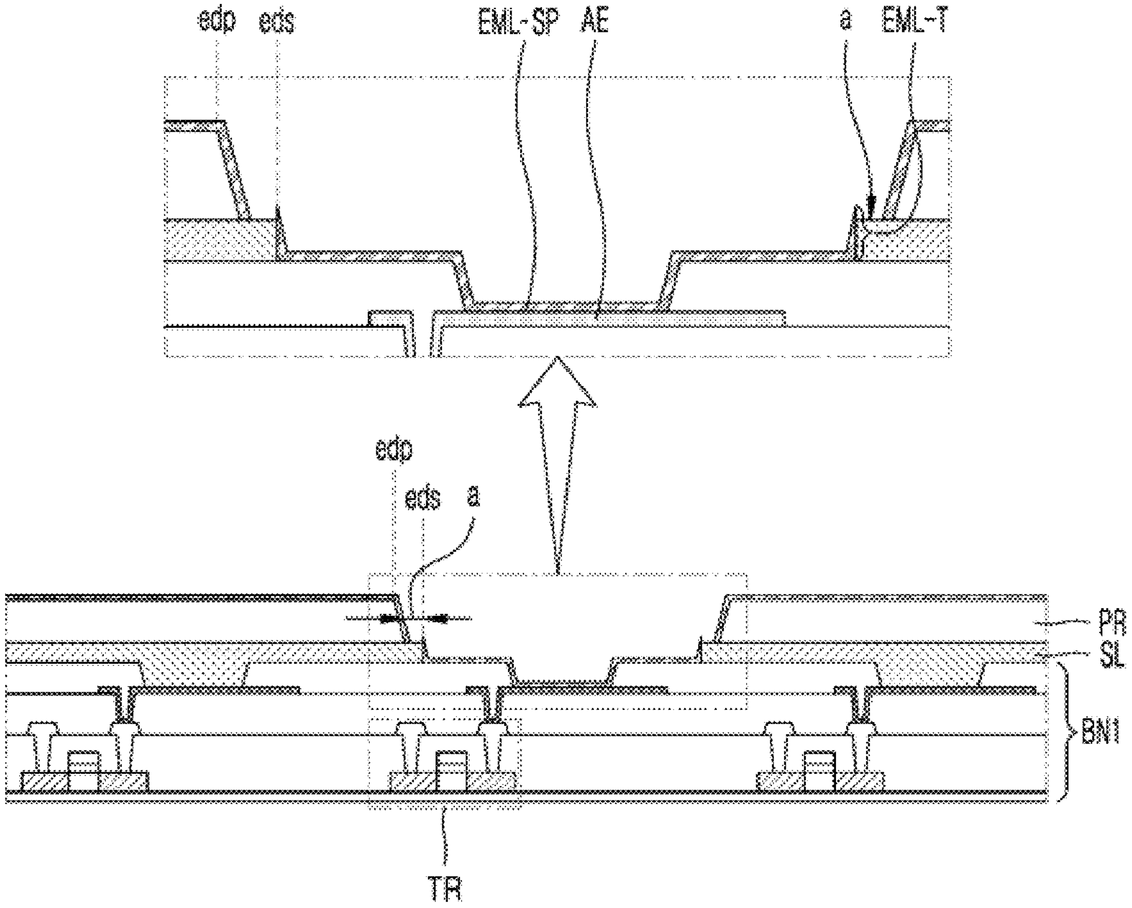
FIGS. 28A to 28C are diagrams illustrating a defect caused by adjusting a depth of an undercut area in the second embodiment of the present disclosure.
Figure 28B:
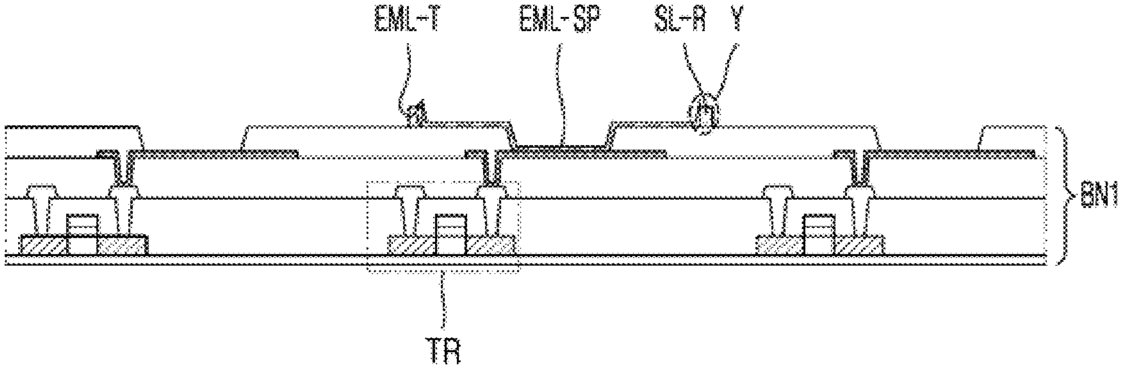
Figure 28C:
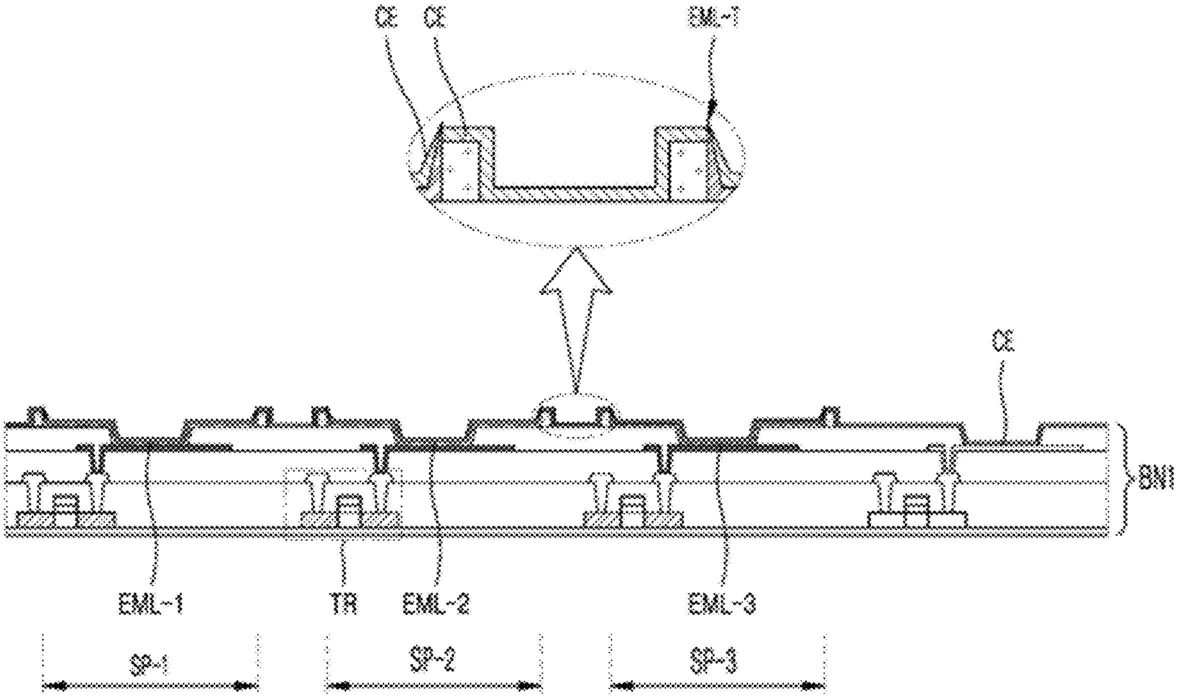

Referring to FIG. 27, the second electrode 240 is formed on the entire surface of the substrate 100. The second electrode 240 can thus function as a common electrode commonly contacting the first sub-pixel pattern 215*a*, the second sub-pixel pattern 225*a*, and the third sub-pixel pattern 235*a* and applying a voltage thereto. The second electrode 240 can also be referred to as a cathode electrode, and supplies electrons to each sub-pixel pattern 215*a*, 225*a*, and 235*a*.

The second electrode 240 may include a transparent metal material that may transmit light therethrough. In one example, the second electrode 240 may be made of a transparent metal oxide such as indium-tin-oxide (ITO) or indium-zinc-oxide (IZO). Alternatively, the second electrode 240 may be made of a semi-transmissive metal material including at least one of molybdenum (Mo), tungsten (W), silver (Ag), or aluminum (Al) and an alloy thereof. Further, in the sub-pixel SUB_E for the auxiliary electrode, the second electrode 240 may directly contact the first electrode 122 such that a combination of the first and second electrodes constitute the auxiliary electrode 245. The auxiliary electrode 245 serves to prevent unbalanced driving voltages.

In this embodiment, the second electrode 240 is formed to have a thickness sized such that the second electrode covers an entirety of each of the tails 215*t*, 225*t*, and 235*t* positioned at each of both opposing distal ends of each sub-pixel pattern 215*a*, 225*a*, and 235*a*.

The first sub-pixel pattern 215*a*, the second sub-pixel pattern 225*a*, the third sub-pixel pattern 235*a*, and the sub-pixel SUB_E for the auxiliary electrode 245 also constitute one pixel. In addition, the pixel includes a plurality of sub-pixels arranged in a matrix form. Accordingly, the sub-pixels SUB_E for the auxiliary electrode extends a mesh shape in a plan view.

The encapsulation layer 250 is formed on the substrate 100 on which the second electrode 240 has been formed. The encapsulation layer 250 blocks the invasion of moisture or oxygen from the outside to improve the reliability of the display device. In addition, the encapsulation layer 250 can be a single layer made of an inorganic or organic material, or a stack of inorganic and organic layers.

According to the second embodiment of the present disclosure, the sub-pixel patterns 215*a*, 225*a*, and 235*a* may include the tails 215*t*, 225*t*, and 235*t* at each of both opposing distal ends thereof, respectively. As described above, these tails 215*t*, 225*t*, and 235*t* are formed by controlling the depth d2 of the first undercut area 210 in the first undercut structure UC1 so as to have the size d2 smaller than the thickness T1 of the first protective layer pattern 200*a*. The depth d2 of the first undercut area 210 can be controlled by adjusting the exposure time of the first protective layer 200 to the fluorine (F)-based organic solvent.

However, the first protective layer 200 can be exposed to the fluorine (F)-based organic solvent for a time duration smaller than a target time duration. Hereinafter, descriptions thereof will be made with reference to the drawings. Referring to FIGS. 28A to 28C, a double layer composed of a protective layer SL and a photoresist pattern PR is formed on a substrate on which underlying structures BNI including a first electrode AE have been formed; then, in a process of exposing the protective layer SL to the fluorine (F)-based organic solvent to form an undercut structure, an exposure time is shorter than a target time duration, such that each of both opposing distal ends eds of the protective layer SL protrudes upwardly from each of both opposing distal ends "edp" of the photoresist pattern PR and thus, a portion of the surface a of the protective layer SL may be exposed.

When the plasma treatment is performed while the surface "a" of the protective layer SL is exposed before deposition of the organic light-emitting layer, the exposed surface a of the protective layer SL can be directly exposed to a substance for the plasma treatment and be cured. The cured protective layer SL is not removed by the fluorine (F)-based organic solvent in the subsequent full lift-off process. When an organic light-emitting layer is deposited to form a sub-pixel pattern EML-SP while each of both opposing distal ends eds of the protective layer SL protrudes upwardly from each of both opposing distal ends edp of the photoresist pattern PR, the sub-pixel pattern EML-SP has a tail EML-T which extends along and on a sidewall surface of each of the opposing distal ends eds of the protective layer SL, and has a thickness larger than that of the protective layer SL.

When the full lift-off process to remove the protective layer SL and the photoresist pattern PR is performed, an entirety of the protective layer SL on one side surface of the tail EML-T of the sub-pixel pattern EML-SP is not removed but a protective layer residue SL-R remains thereon, as indicated by a 'Y' portion of FIG. 28B.

When a second electrode CE is formed on the sub-pixel pattern EML-SP while the protective layer residue SL-R remains, the second electrode CE is discontinuous at the tail EML-T each of the sub-pixel patterns EML-1, EML-2, and EML-3, as shown in FIG. 28C. Further, the second electrode CE commonly contacts with a first sub-pixel pattern EML-1, a second sub-pixel pattern EML-2 and a third sub-pixel pattern EML-3 and applies a voltage thereto. Thus, when the second electrode CE is discontinuous, a defect occurs in which at least one of the plurality of sub-pixels SP-1, SP-2, and SP-3 does work, thereby reducing the reliability of the display device.

Accordingly, it is preferable that the depth of the undercut area of the undercut structure composed of the double layer, that is, the protective layer and the photoresist pattern has a size larger or smaller than the thickness of the protective layer. It is preferable to perform the lift-off process while a portion of the protective layer outwardly of the distal end of the photoresist pattern is not directly exposed to the outside.

In one example, a method of forming a sub-pixel pattern via a patterning process using an undercut structure can be applied to a display device that emits white light. This will be described below with reference to the drawings. FIGS. 29 to 36 are diagrams illustrating a third embodiment of the present disclosure. Further, the same reference numerals are used for the same or similar components as those in FIGS. 4 to 19.

Figure 29:
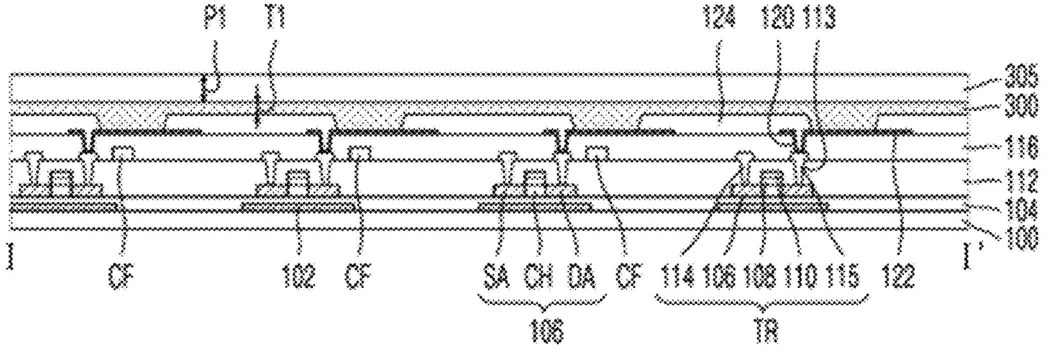
FIGS. 29 to 36 are diagrams illustrating an organic light-emitting display device according to a third embodiment of the present disclosure.

Referring to FIG. 29, the light-blocking layer 102, the buffer layer 104, the thin-film transistor Tr, the interlayer insulating film 112, the source electrode 114, the drain electrode 115, the planarization film 116, the first electrode 122, and the bank 124 are disposed on the substrate 100. A color filter CF is disposed on the interlayer insulating film 112 and is disposed at a position overlapping the light-emitting area defined by the bank hole 125. When the organic light-emitting layer is made of an organic material that emits white light, the color filter CF can render a color allocated to each sub-pixel. For example, the color filter CF may be one of red R, green G, and blue B.

A protective layer 300 having the first thickness T1 is formed on the entire surface of the substrate 100 on which the above-described components have been formed. Then, a photoresist layer 305 of the first thickness P1 is formed thereon. The protective layer 300 is made of a fluoropolymer material containing a large amount of fluorine (F) at a functional group thereof and has the orthogonality. The photoresist layer 305 formed on the protective layer 300 is preferably formed to have a thickness sized such that the first photoresist layer 305 may be prevented from being depressed downwardly or collapsing in a subsequent process of forming an undercut area.

Figure 30:
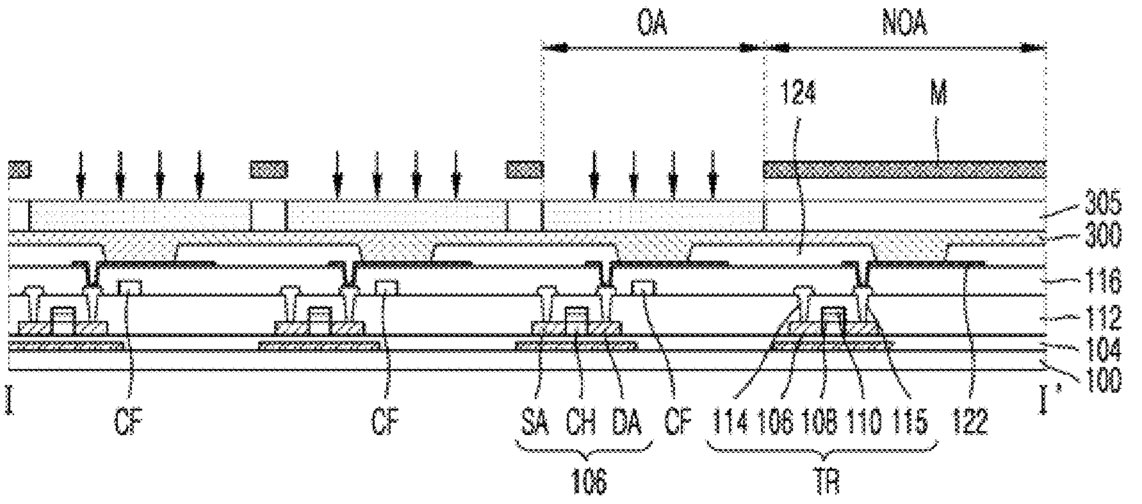

Referring to FIG. 30, a photomask M having an open area OA and a non-open area NOA is disposed on the photoresist layer 305. The open area OA of the photomask M exposes a surface of the photoresist layer 305 in an area where each sub-pixel pattern is to be formed. A light blocking portion prevents light from being incident on a surface of the photoresist layer 305 in an area where a sub-pixel for an auxiliary electrode is to be formed. Next, an exposure process of exposing the photoresist layer 305 to light such as ultraviolet (UV) light through the open area OA of the photomask M is performed.

Figure 31:
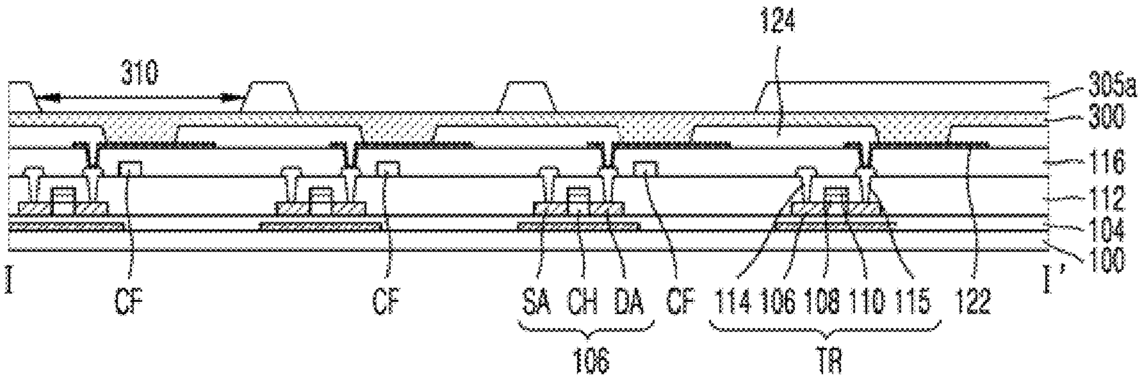

Referring to FIG. 31, a photoresist pattern 305*a* is formed by performing a development process of selectively removing only a portion of the photoresist layer 305 exposed to ultraviolet (UV) light. The photoresist pattern 305*a* has an opening area 310 that defines an area in which each sub-pixel pattern of the organic light-emitting layer is to be formed. A portion of a surface of the protective layer 300 is exposed through the opening area 310 of the photoresist pattern 305*a*. Then, the area where the sub-pixel for the auxiliary electrode is to be formed is covered with the photoresist pattern 305*a*.

Figure 32:
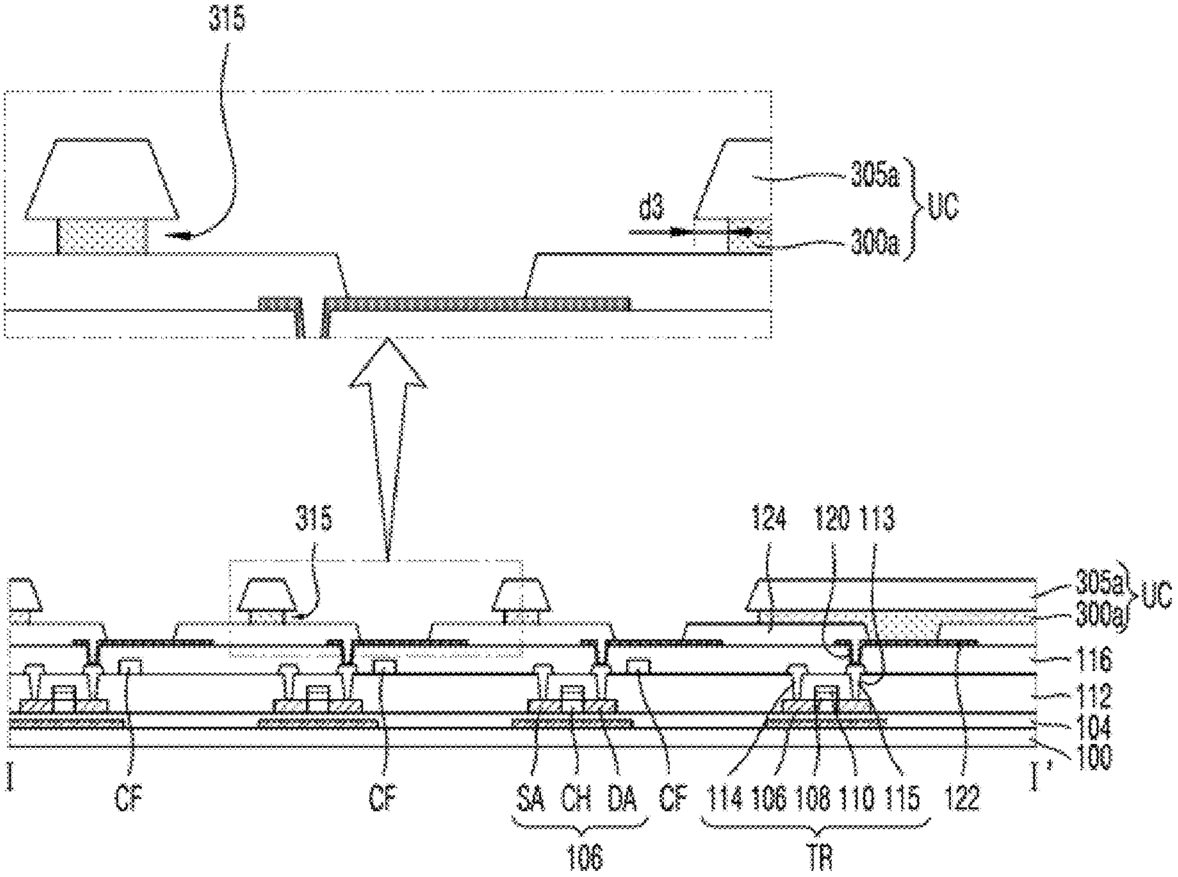

Referring to FIG. 32, an undercut structure UC is formed by performing a patterning process using the photoresist pattern 305*a* as an etching mask. The undercut structure UC is composed of a double layer, that is, the protective layer pattern 300*a* and the photoresist pattern 305*a*. An undercut area 315 is disposed under the photoresist pattern 305*a*.

The undercut structure UC has an undercut shape with respect to the photoresist pattern 305*a*. The undercut structure UC is obtained by additionally removing the protective layer pattern 300*a* by a predefined depth d3 inwardly from each of both opposing distal ends ed of the photoresist pattern 305*a*. The patterning process to form the undercut structure UC can be performed via a lift-off scheme using a fluorine-based organic solvent. The fluorine (F)-based organic solvent invades into and selectively removes the protective layer 300 to form the protective layer pattern 300*a*.

The undercut structure UC according to the third embodiment of the present disclosure defines all of areas in which the plurality of sub-pixel patterns are to be subsequently formed, respectively. For example, the undercut structure UC can expose all of the areas in which the first sub-pixel pattern, the second sub-pixel pattern, and the third sub-pixel pattern are to be formed, respectively.

Figure 33:
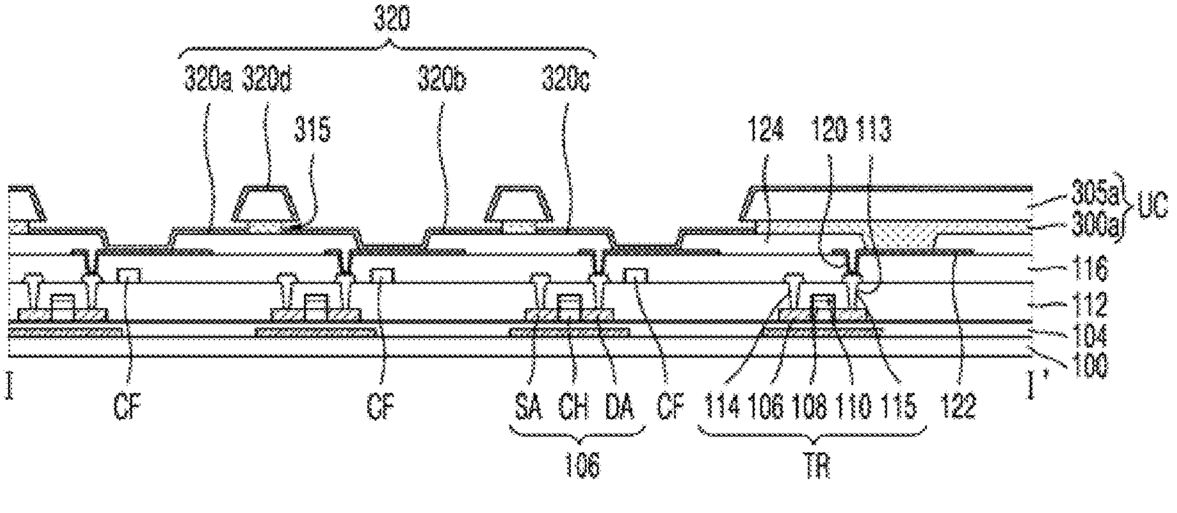

Referring to FIG. 33, an organic light-emitting layer 320 including a first sub-pixel pattern 320*a*, a second sub-pixel pattern 320*b*, a third sub-pixel pattern 320*c* and an organic material layer 320*d* is formed on the substrate 100. In more detail, first, plasma treatment is performed on the substrate 100 on which the undercut area 315 has been formed. After the plasma treatment is conducted, the organic light-emitting layer 320 is formed on the substrate 100.

The organic light-emitting layer 320 is formed on an exposed surface of the first electrode 122 and the surface of the photoresist pattern 305*a*. Each sub-pixel pattern 320*a*, 320*b*, and 320*c* is formed on the bank 124 and in the undercut area 315 of the undercut structure UC. Accordingly, each sub-pixel pattern 320*a*, 320*b*, and 320*c* is formed to cover the exposed surface of the first electrode 122 and cover the top surface of the bank 124 and conformally cover a sidewall and a bottom of the bank hole 125 of the bank 124. Each sub-pixel pattern 320*a*, 320*b* and 320*c* extends and contacts a sidewall of the protective layer pattern 300*a*. However, the disclosure is not limited thereto. In one example, each pixel pattern 320*a*, 320*b* and 320*c* extends to be adjacent to but in non-contact with a sidewall of the protective layer pattern 300*a*. An organic material layer 320*d* can also be formed on an exposed surface of the photoresist pattern 305*a*.

Figure 34:
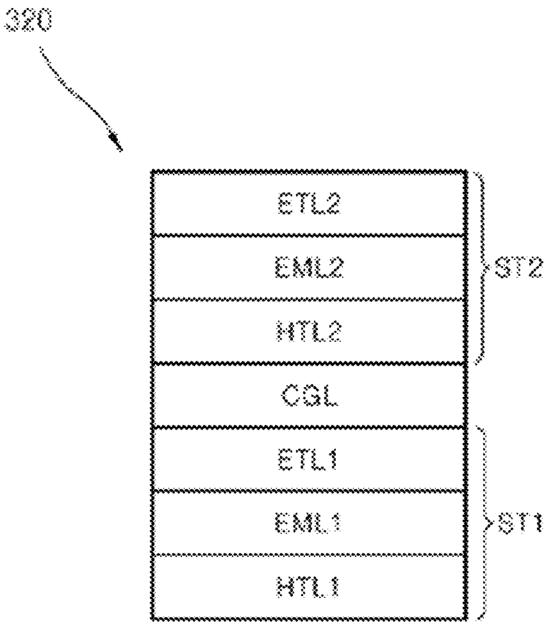

Referring to FIG. 34, the organic light-emitting layer 320 according to the third embodiment of the present disclosure has a tandem structure in which a plurality of light-emitting stacks ST1 and ST2 for emitting white light are stacked with each other in a multi-stack manner. One light-emitting stack of the organic light-emitting layer 320 may have a structure in which the hole transport layer HTL, the light-emitting layer EML, and the electron transport layer ETL are sequentially stacked with each other. In another example, one light-emitting stack of the organic light-emitting layer 320 may have a structure in which a hole transport layer HTL, a light-emitting layer EML, an electron transport layer ETL, a hole blocking layer HBL, a hole injecting layer HIL, an electron blocking layer EBL, and an electron injecting layer EIL are stacked with each other.

In one example, the organic light-emitting layer 320 may have a structure in which a first light-emitting stack ST1 and a second light-emitting stack ST2 are stacked with each other, wherein the first light-emitting stack ST1 has a structure in which a first hole transport layer HTL1, a first light-emitting layer EML1 and a first electron transport layer ETL1 are stacked with each other, and the second light-emitting stack ST2 has a structure in which a second hole transport layer HTL2, a second light-emitting layer EML2 and a second electron transport layer ETL2 are stacked with each other. Further, the first light-emitting stack ST1 may include the first light-emitting layer EML1 emitting light of a first color, and the second light-emitting stack ST2 may include the second light-emitting layer EML2 emitting light of a second color different from the first color. However, the present disclosure is not limited thereto. In another example, when the organic light-emitting layer 320 is composed of three light-emitting stacks stacked with each other, each of two of the three light-emitting stacks may include a blue light-emitting layer B-EML and a remaining light-emitting stack thereof may include an orange light-emitting layer OR-EML.

Further, a charge generating layer CGL can be disposed between the first light-emitting stack ST1 and the second light-emitting stack ST2. The charge generating layer CGL serves to supply electric charges to each of the first light-emitting stack ST1 and the second light-emitting stack ST2.

Figure 35:
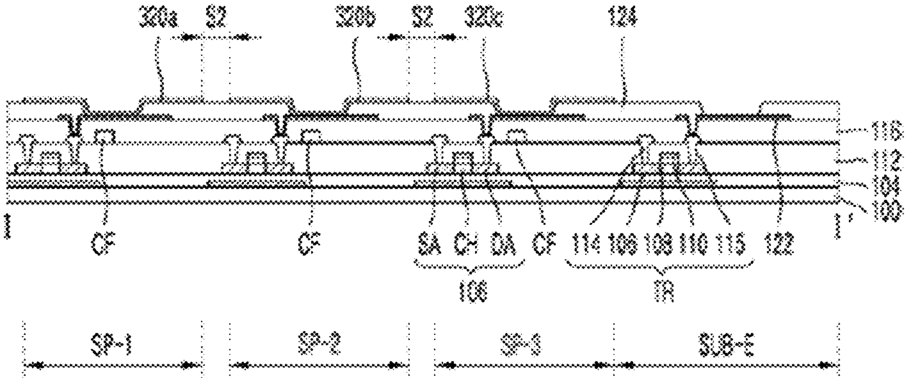

Referring to FIG. 35, the full lift-off process to remove the undercut structure UC on the substrate 100 is performed. The full lift-off process can be performed using a fluorine (F)-based organic solvent. The fluorine (F)-based organic solvent invades into the protective layer pattern 300*a* and peels off the protective layer pattern 300*a* from the bank 124 and the first electrode 122. Then, the photoresist pattern 305*a* and the organic material layer 320*d* disposed on the protective layer pattern 300*a* are removed together while the protective layer pattern 300*a* is peeled off and removed from the bank and the first electrode.

During the full lift-off process, the organic material constituting each of the first sub-pixel pattern 320*a*, the second sub-pixel pattern 320*b* and the third sub-pixel pattern 320*c* are resistant to the fluorine (F)-based organic solvent and thus do not deteriorate or change, and are not damaged.

Adjacent ones of the first sub-pixel pattern 320*a*, the second sub-pixel pattern 320*b*, and the third sub-pixel pattern 320*c* are spaced apart from each other by a predefined distance S2. Areas in which the first to third sub-pixel patterns 320*a*, 320*b*, and 320*c* are formed, respectively, are defined as the first to third sub-pixels SP-1, SP-2, and SP-3, respectively.

Each of the first to third sub-pixel patterns 320*a*, 320*b*, and 320*c* can have a rectangular shape including the outer portion BD and the inner trench portion TC disposed inwardly of the outer portion BD as shown in FIG. 3 in a plan view. In a plan view, the outer portion BD includes a plurality of annular portions horizontally arranged in a stepped manner such that a thickness of an innermost annular portion (or ring) among the plurality of annular portions is the largest while a thickness of an outermost annular portion among the plurality of annular portions is the smallest. Further, as the inner, middle, and outer rings of the outer portion BD of each sub-pixel pattern 320*a*, 320*b*, and 320*c* are arranged in a stepped manner in a plan view, electrical resistance is rapidly increased between the rings. Further, this rapid increase is repeated. Thus, the leakage current can be reduced more effectively.

Further, a thickness of each of the outer portion of each sub-pixel pattern 320*a*, 320*b*, and 320*c* can increase step by step as the pattern extends toward the bank hole. Thus, as the thickness of each sub-pixel pattern 320*a*, 320*b*, and 320*c* gradually becomes smaller as each pattern extends outwardly, the leakage current can be reduced.

Figure 36:
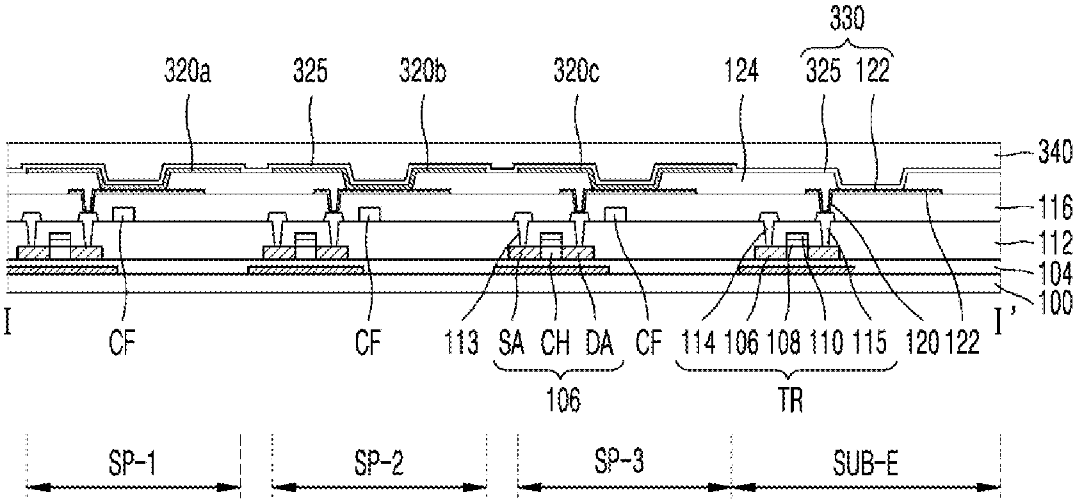

Referring to FIG. 36, a second electrode 325 is formed on the entire surface of the substrate 100 and can function as a common electrode commonly contacting the first to third sub-pixel patterns 320*a*, 320*b*, and 320*c* and applying the voltage thereto. The second electrode 325 can also be referred to as a cathode electrode, and supplies electrons to each sub-pixel pattern 320*a*, 320*b* and 320*c*.

In one example, the second electrode 325 directly contacts the first electrode 122 in the sub-pixel SUB_E for the auxiliary electrode such that the second electrode 325 and the first electrode 122 constitute an auxiliary electrode 330. Accordingly, the first to third sub-pixel patterns 320*a*, 320*b*, and 320*c*, and the auxiliary electrode 330 constitute one pixel. In addition, the pixel includes a plurality of sub-pixels arranged in a matrix form. Accordingly, the sub-pixel SUB_E for the auxiliary electrode extends in a mesh shape in a plan view.

An encapsulation layer 340 is also disposed on the second electrode 325 and blocks the invasion of moisture or oxygen from the outside to improve the reliability of the display device. The encapsulation layer 340 can be embodied as a single layer made of an inorganic or organic material, or a multilayer in which inorganic and organic layers are stacked.

In the display device according to the third embodiment of the present disclosure, the organic light-emitting layer has a multi-stack structure in which a plurality of light-emitting stacks for emitting white light are stacked with each other and the charge generating layer CGL is interposed between adjacent ones of the stacks. Further, the charge generation layer CGL refers to a layer for generating electrons and holes and stably supplying the generated electrons and holes to the electron transport layer ETL and the hole transport layer HTL.

Further, according to embodiments of the present disclosure, leakage current from the charge generation layer CGL is prevented. Accordingly, in a fourth embodiment of the present disclosure, a structure capable of preventing the leakage current generation from the charge generation layer CGL will be described below with reference to the drawings.

Figure 37:
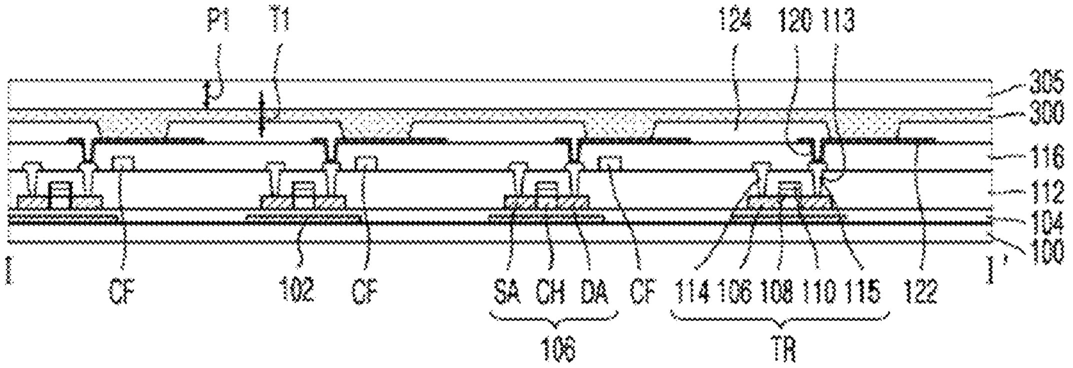
FIGS. 37 to 43 are diagrams illustrating an organic light-emitting display device according to a fourth embodiment of the present disclosure.

In particular, FIGS. 37 to 43 are cross-sectional views illustrating a method for manufacturing a display device according to a fourth embodiment of the present disclosure. Referring to FIG. 37, the light-blocking layer 102, the buffer layer 104, the thin-film transistor TR, the interlayer insulating film 112, the color filter CF, the source electrode 114, the drain electrode 115, the planarization film 116, the first electrode 122 and the bank 124 are disposed on the substrate 100.

The protective layer 300 having the first thickness T1 is formed on the entire surface of the substrate 100 on which the above-described components have been formed. Then, a photoresist layer 305 of the first thickness P1 is formed thereon. The protective layer 300 is made of a fluoropolymer material containing a large amount of fluorine (F) at a functional group thereof and has the orthogonality.

Figure 38:
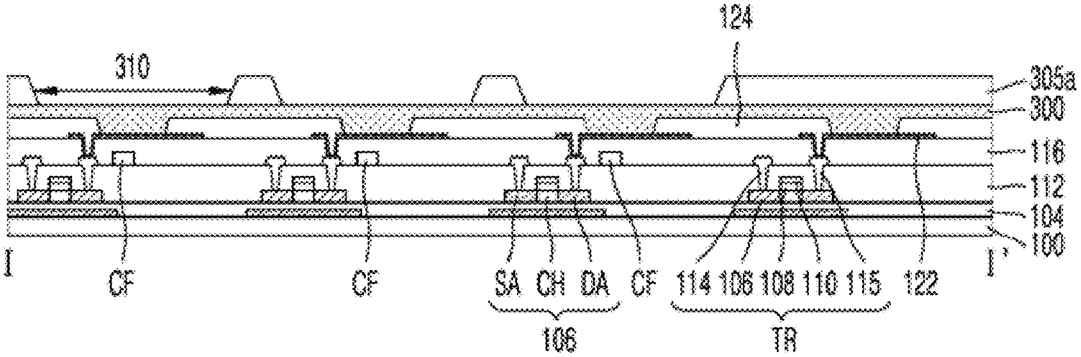

Referring to FIG. 38, the photoresist pattern 305*a* is formed by performing a development process of selectively removing only a portion of the photoresist layer 305 exposed to ultraviolet (UV) light. The photoresist pattern 305*a* has the opening area 310 that defines an area in which each sub-pixel pattern of the organic light-emitting layer is to be formed. A portion of a surface of the protective layer 300 is exposed through the opening area 310 of the photoresist pattern 305*a*. Then, the area where the sub-pixel for the auxiliary electrode is to be formed is covered with the photoresist pattern 305*a*.

Figure 39:
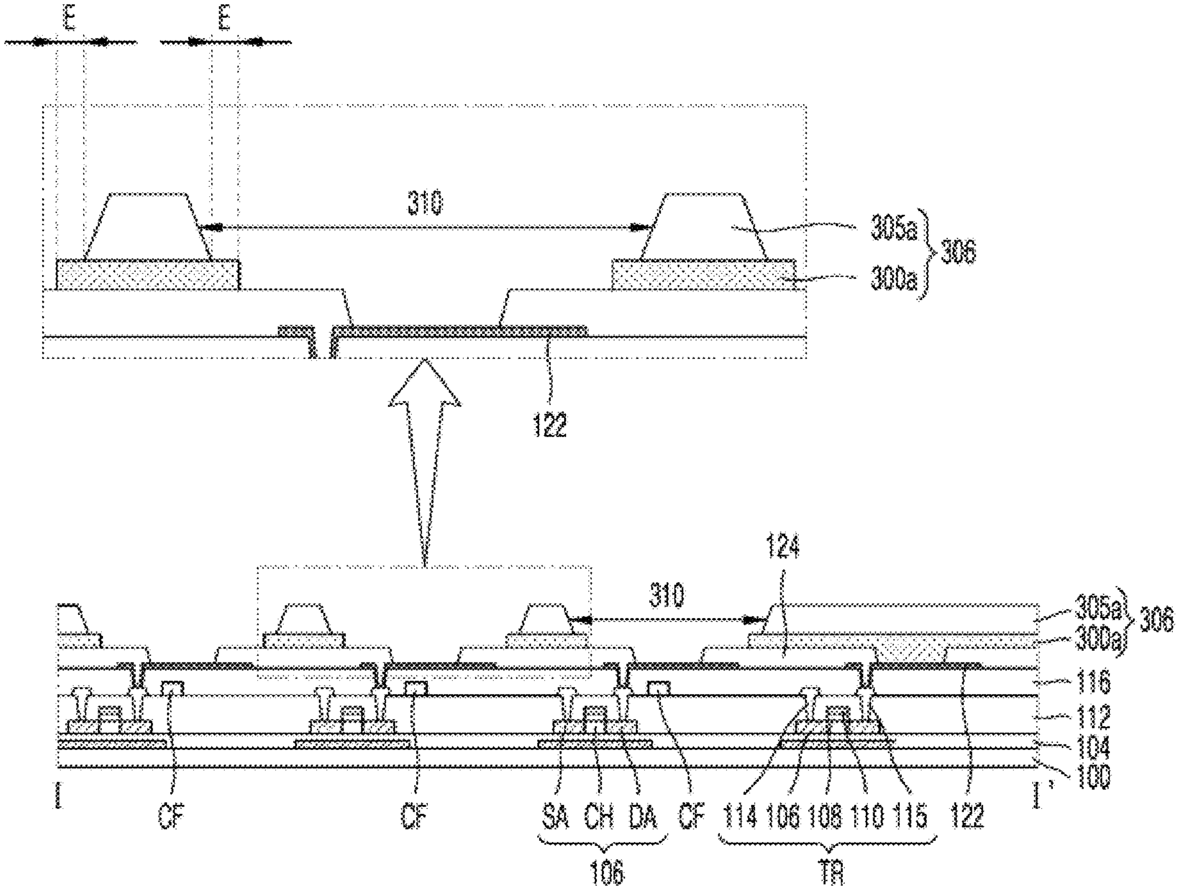

Referring to FIG. 39, a patterning process using the photoresist pattern 305*a* as an etching mask is performed to form a mold structure 306. The patterning process can use a lift-off process scheme in which the protective layer 300 is exposed to the fluorine (F)-based organic solvent.

The mold structure 306 is composed of a double layer, that is, the protective layer pattern 300*a* and the photoresist pattern 305*a*. Further, the protective layer pattern 300*a* protrudes outwardly from a distal end of the photoresist pattern 305*a* by a predefined area E. In more detail, a time duration for which the protective layer 300 is exposed to the fluorine (F)-based organic solvent during the lift-off process can be adjusted based on a time-point at which a surface of the protective layer pattern 300*a* is exposed. Then, a width between distal ends facing each other of neighboring photoresist patterns 305*a* as an opening area 310 of the photoresist pattern 305*a* can be larger than a width between distal ends facing each other of neighboring protective layer patterns 300*a*.

Figure 40:
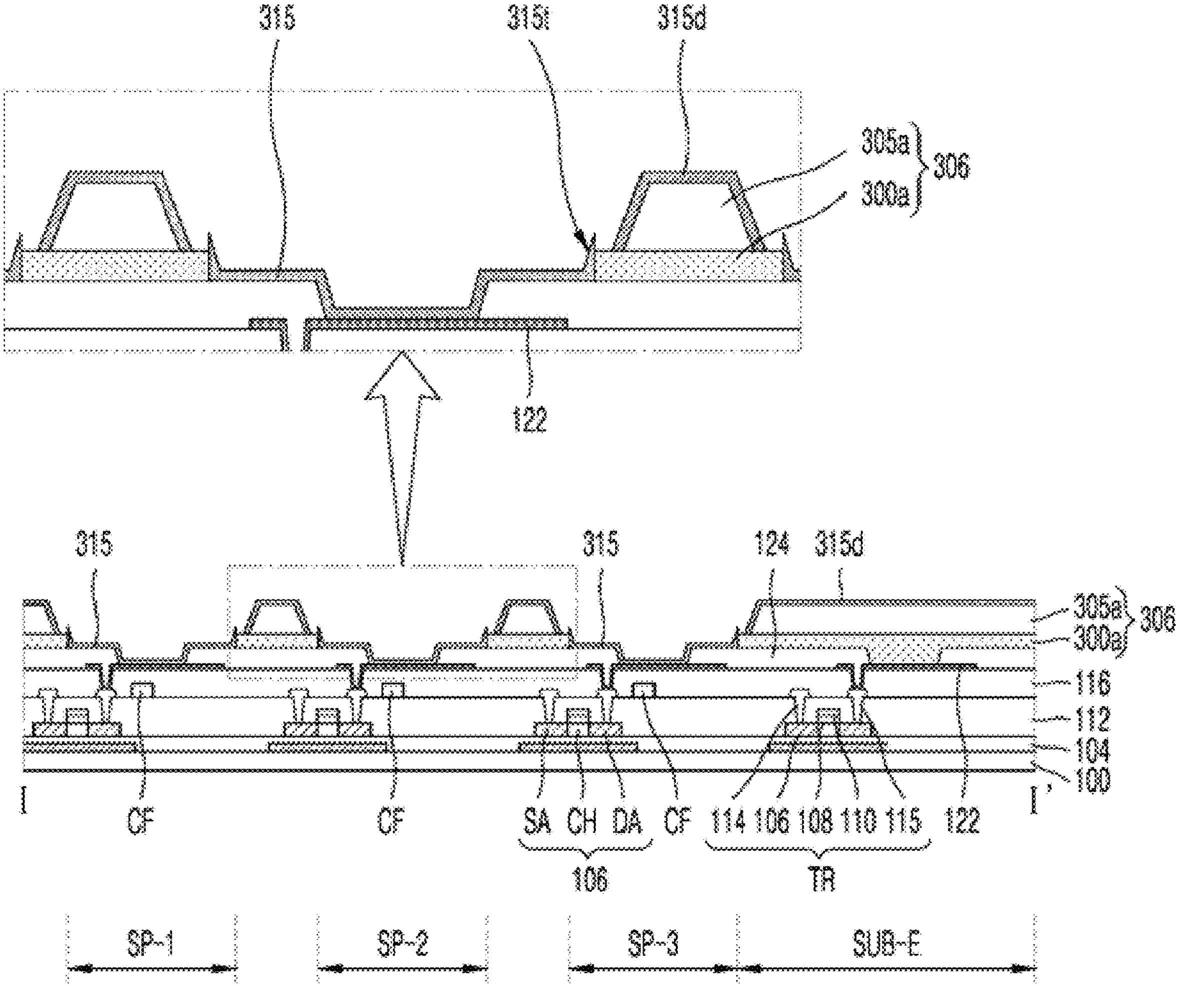

Referring to FIG. 40, a first light-emitting stack 315 and an organic material layer 315*d* are formed on the first to third sub-pixels SP-1, SP-2, and SP-3 of the substrate 100. That is, first, plasma treatment is performed on the substrate 100 on which the mold structure 306 has been formed. When the plasma treatment is performed, the exposed surface of the protective layer pattern 300*a* is directly exposed to a substance for the plasma treatment and are cured.

When the organic light-emitting layer is deposited while the distal end of the protective layer pattern 300*a* protrudes outwardly from the distal end of the photoresist pattern 305*a*, the first light-emitting stack 315 formed on each of the first to third sub-pixels SP-1, SP-2, and SP-3 include a tail 315*t* extending to a sidewall surface of a distal end of the protective layer pattern 300*a* and having a thickness larger than a thickness of the protective layer pattern 300*a*.

Specifically, to form the tandem structure shown in FIG. 34, first, the first light-emitting stack 315 having a structure in which the first hole transport layer HTL1, the first light-emitting layer EML1 and the first electron transport layer ETL1 are stacked with each other is formed on the substrate 100 on which the mold structure 306 has been formed. Thus, the tail 315*t* extending to the sidewall surface of the distal end of the protective layer pattern 300*a* can be formed. The first light-emitting stack 315 includes the tail 315*t*.

Figure 41:
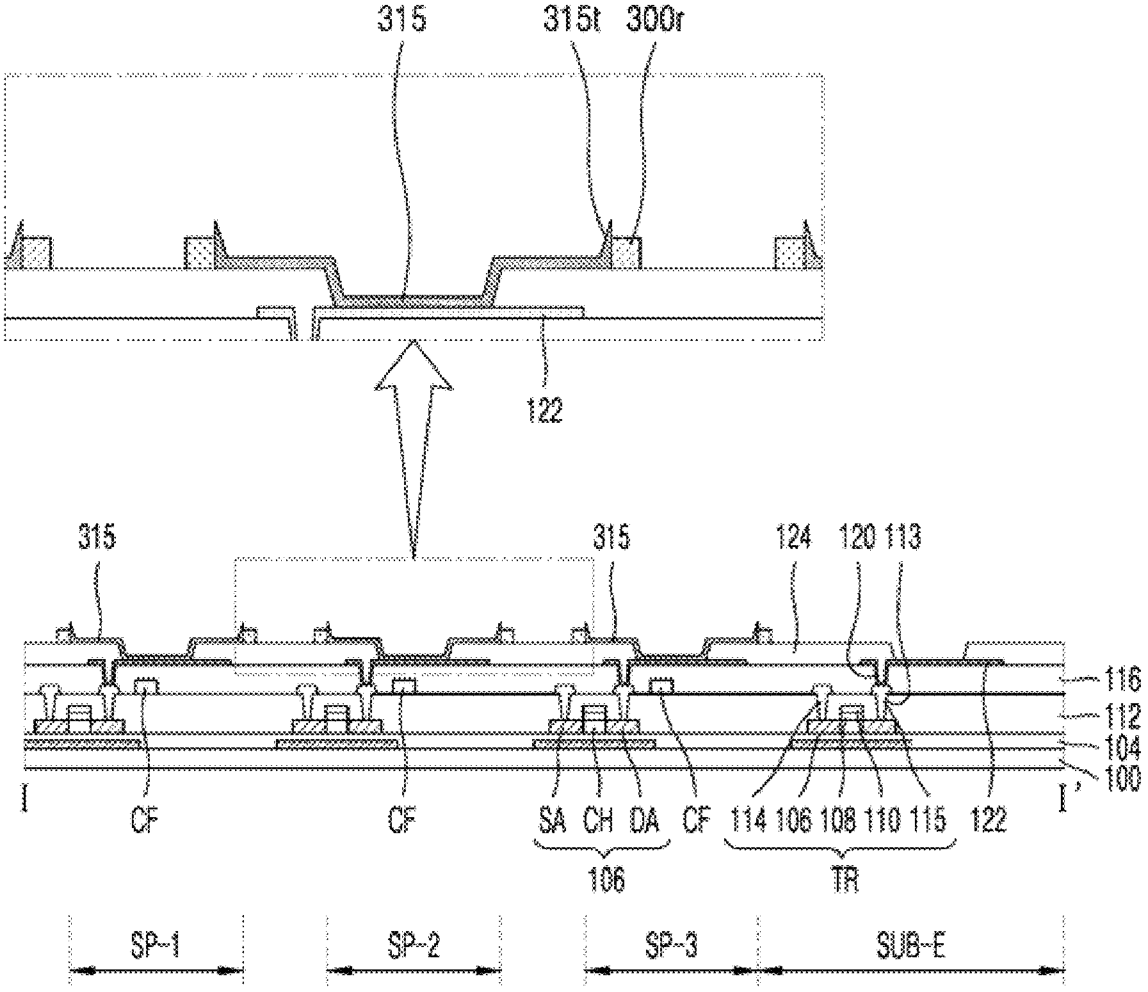

Referring to FIG. 41, a full lift-off process is performed to remove the mold structure 306. The full lift-off process can be performed using a fluorine (F)-based organic solvent. As the cured portion of the protective layer pattern 300*a* is not removed when the full lift-off process is performed, a residual pattern of the protective layer pattern 300*a* remains on an outer side surface of each of both opposing tails 315*t* of the first light-emitting stack 315. This residual pattern can be referred to as a tail side support portion 300*r*. Further, a vertical level of a top of the tail side support portion 300*r* is lower than a vertical level of a top of the tail 315*t* of the first light-emitting stack 315.

Figure 42:
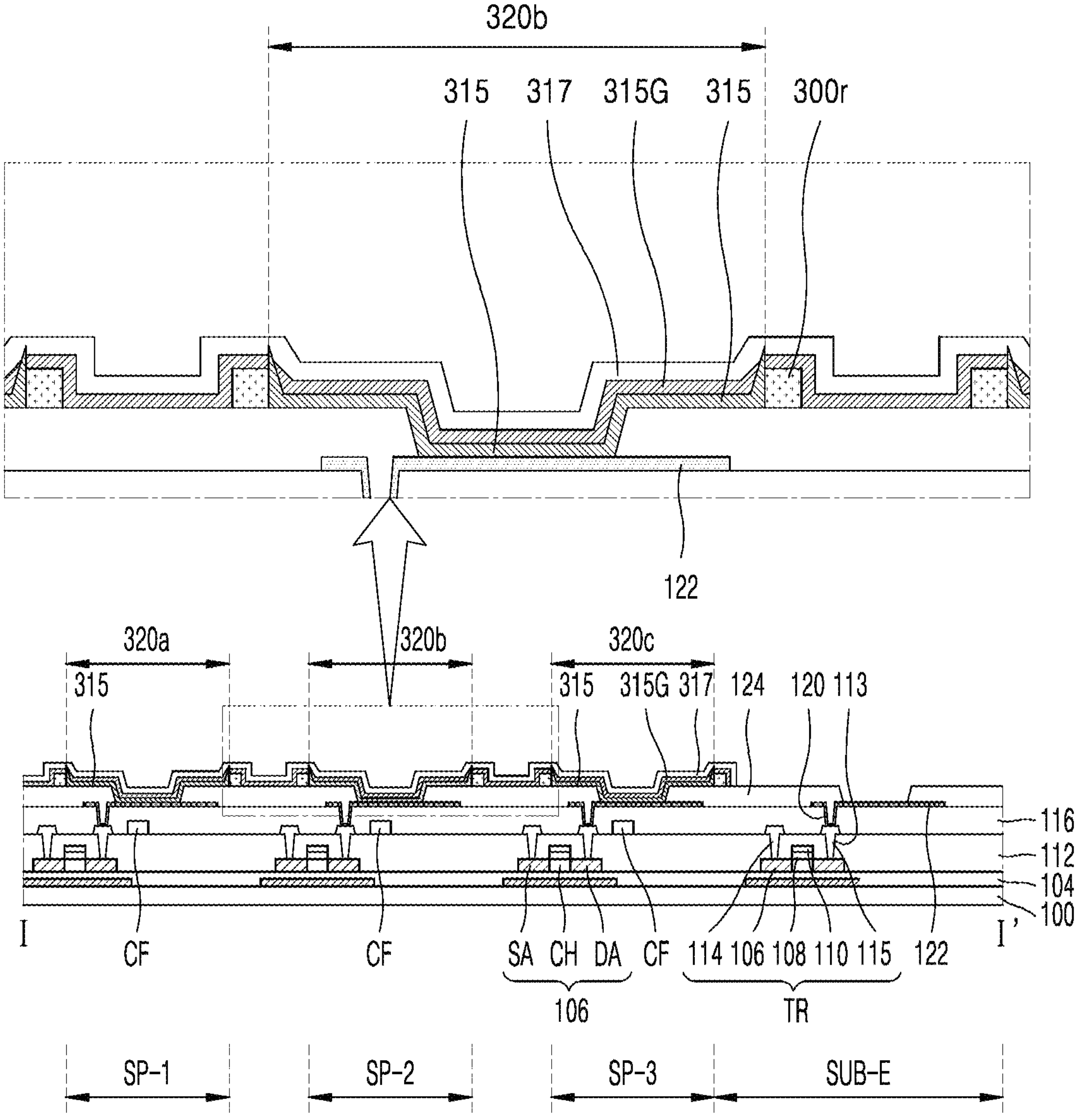

Referring to FIG. 42, a charge generation layer 315G and a second light-emitting stack 317 are formed on the first light-emitting stack 315. A vertical level of a top of the charge generation layer 315G is lower than a vertical level of a top of the tail 315*t* of the first light-emitting stack 315. Accordingly, the charge generation layers 315G of adjacent ones of the first to third sub-pixels SP-1, SP-2, and SP-3 can be isolated from each other.

The second light-emitting stack 317 is formed on the charge generation layer 315G isolated from an adjacent one via the tail 315*t* of the first light-emitting stack 315 and extend along the first sub-pixel SP-1, the second sub-pixel SP-2, the third sub-pixel SP-3 and the sub-pixel SUB_E for the auxiliary electrode in a seamless manner. The second light-emitting stack 317 includes the second hole transport layer HTL2, the second light-emitting layer EML2 emitting light of a color different from a color of light from the first light-emitting layer EML1, and the second electron transport layer ETL2, as shown in FIG. 34. The charge generating layer CGL supplies charges to each of the first light-emitting stack 315 and the second light-emitting stack 317.

Accordingly, the first sub-pixel pattern 320*a*, the second sub-pixel pattern 320*b*, and the third sub-pixel pattern 320*c* can be formed in the first to third sub-pixels SP-1, SP-2, and SP-3, respectively such that each of the first sub-pixel pattern 320*a*, the second sub-pixel pattern 320*b*, and the third sub-pixel pattern 320*c* includes the first light-emitting stack 315, the charge generation layer 315G and the second light-emitting stack 317.

When the organic light-emitting layer is made of an organic material that emits white light, the organic light-emitting layer seamlessly extends along and in the first sub-pixel pattern to the third sub-pixel pattern. In this instance, the charge generation layer continuously extends along and in the first sub-pixel pattern to the third sub-pixel pattern, such that leakage current can flow to the adjacent sub-pixel pattern, and thus an unintended sub-pixel may be activated. When the unintentional sub-pixel is activated, a defect in the image quality may occur.

In order to solve the above problem, according to the fourth embodiment of the present disclosure, the first light-emitting stack 315 formed in each sub-pixel SP-1, SP-2, and SP-3 has the tail 315*t*. Further, a vertical level of a top of the charge generation layer 315G is lower than a vertical level of a top of the tail 315*t*. Thus, the charge generation layer 315G of each of the first to third sub-pixels SP-1, SP-2, and SP-3 may have an isolated shape. Accordingly, the charge generation layer 315G disposed between the first light-emitting stack 315 and the second light-emitting stack 317 is physically discontinuous due to the tail 315*t*. That is, the charge generation layers 315G of adjacent ones of the first sub-pixel pattern 320*a*, the second sub-pixel pattern 320*b*, and the third sub-pixel pattern 320*c* respectively in the first to third sub-pixels SP-1, SP-2, and SP-3 are isolated from each other. That is, the path of the leakage current induced from the charge generation layer 315G is physically discontinuous such that the leakage current can be prevented and thus the image quality can be improved.

Figure 43:
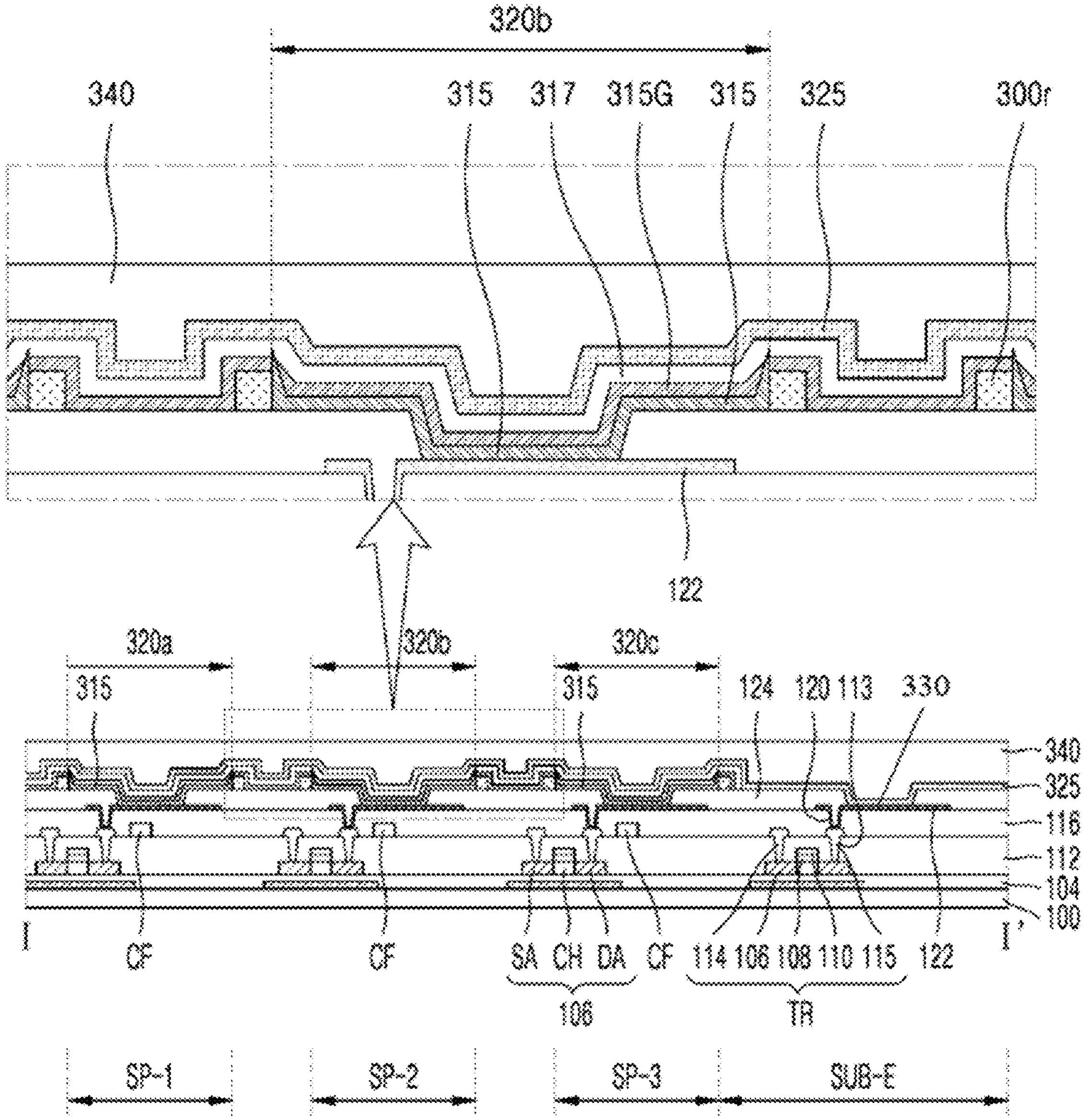

Referring to FIG. 43, the second electrode 325 is formed on the entire surface of the substrate 100 and can function as a common electrode commonly contacting the first to third sub-pixel patterns 320*a*, 320*b*, and 320*c* and applying the voltage thereto. The second electrode 325 can also be referred to as a cathode electrode, and supplies electrons to each sub-pixel pattern 320*a*, 320*b* and 320*c*.

In one example, the second electrode 325 directly contacts the first electrode 122 in the sub-pixel SUB_E for the auxiliary electrode such that the second electrode 325 and the first electrode 122 constitute an auxiliary electrode 330. Accordingly, the first to third sub-pixel patterns 320*a*, 320*b*, and 320*c*, and the auxiliary electrode 330 constitute one pixel. The auxiliary electrode serves to prevent unbalanced driving voltages.

The encapsulation layer 340 is disposed on the second electrode 325 and blocks the invasion of moisture or oxygen from the outside to improve the reliability of the display device. The encapsulation layer 340 may be embodied as a single layer made of an inorganic or organic material, or a multilayer in which inorganic and organic layers are stacked.

In the method of manufacturing the display device according to the fourth embodiment of the present disclosure, the organic light-emitting layer has a tandem structure in which a plurality of light-emitting stacks and for emitting white light are stacked with each other in a multi-stack manner. Further, the charge generating layer CGL is physically discontinuous, thereby preventing leakage current and thus improving image quality.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:

a plurality of pixels disposed on a substrate, each of the plurality of pixels including a plurality of sub-pixels, wherein at least one sub-pixel among the plurality of sub-pixels includes:

a first electrode disposed on the substrate;

a bank disposed on the first electrode and including a bank hole exposing a portion of the first electrode; and a first light emitting layer disposed in the bank hole, the first light emitting layer contacting an upper surface of the portion of the first electrode and extending continuously on sidewalls of the bank hole and along a top edge portion of the bank, wherein an outer edge portion of the first light emitting layer disposed on the top edge portion of the bank extends in a direction from the bank hole toward an adjacent sub-pixel that is adjacent to the at least one sub-pixel, wherein the outer edge portion of the first light emitting layer includes a plurality of stepped portions arranged in the direction from the bank hole toward the adjacent sub-pixel, wherein the plurality of stepped portions have different thicknesses, wherein the different thicknesses of the plurality of stepped portions stepwise decrease in the direction from the bank hole toward the adjacent sub-pixel, and wherein the first light emitting layer terminates in an area between the at least one sub-pixel and the adjacent sub-pixel.

2. The display device of claim 1, wherein the first light emitting layer includes:

a first light-emitting stack including a first hole transport layer, a first light-emitting layer, and a first electron transport layer stacked with each other, and wherein the display device further comprises:

a charge generation layer disposed on the first light-emitting stack of the first light emitting layer; and a second light-emitting stack disposed on the charge generation layer and including a second hole transport layer, a second light-emitting layer emitting light of a different color from a color of light emitted from the first light-emitting layer, and a second electron transport layer.

3. The display device of claim 1, wherein the plurality of sub-pixels comprise:

a first sub-pixel configured to emit a first color;

a second sub-pixel configured to emit a second color;

a third sub-pixel configured to emit a third color; and an auxiliary sub-pixel including a first electrode and a second electrode that are in direct contact with each other.

4. The display device of claim 1, wherein the first light emitting layer includes:

an outer pattern portion that forms the outer edge portion of the first light emitting layer, extends along top outside edge surfaces of the bank, and includes the plurality of stepped portions; and an inner trench pattern portion disposed on the upper surface of the portion of the first electrode and on the sidewalls of the bank hole.

5. The display device of claim 4, wherein in a plan view, the outer pattern portion includes a plurality of annular pattern portions that correspond to the plurality of stepped portions of the outer edge portion and are arranged in a stepped manner such that a thickness of an innermost annular pattern portion is larger than a thickness of an outermost annular pattern portion.

6. The display device of claim 1, wherein the plurality of stepped portions of the outer edge portion include:

a first stepped portion disposed on the top edge portion of the bank;

a second stepped portion disposed on the top edge portion of the bank; and a third stepped portion disposed on the top edge portion of the bank.

7. The display device of claim 6, wherein the first stepped portion has a first thickness, wherein the second stepped portion has a second thickness smaller than the first thickness, and wherein the third stepped portion has a third thickness smaller than the second thickness.

8. The display device of claim 7, wherein the first stepped portion is located adjacent to the bank hole, wherein the third stepped portion is located adjacent to the adjacent sub-pixel, and wherein the second stepped portion is located between the first stepped portion and the third stepped portion.

9. The display device of claim 8, wherein the third stepped portion defines a terminal edge of the first light emitting layer, and the terminal edge is spaced apart from a light emitting layer of the adjacent sub-pixel.

10. The display device of claim 1, wherein in a plan view, the plurality of stepped portions surround the bank hole and are arranged as a plurality of concentric rings having different thicknesses.

11. The display device of claim 10, wherein the plurality of concentric rings include:

an inner ring corresponding to a portion of the outer edge portion having a largest thickness among the plurality of stepped portions;

an outer ring corresponding to a portion of the outer edge portion having a smallest thickness among the plurality of stepped portions; and a middle ring disposed between the inner ring and the outer ring and having a thickness smaller than that of the inner ring and larger than that of the outer ring.

12. The display device of claim 1, further comprising:

a second electrode disposed on the first light emitting layer, wherein the second electrode covers the plurality of stepped portions of the outer edge portion and extends across the first light emitting layer of the at least one sub-pixel and a first light emitting layer of the adjacent sub-pixel.

13. A display device comprising:

a first electrode disposed on a substrate, the first electrode corresponding to a first sub-pixel;

a bank disposed on the first electrode and having a bank hole that exposes a portion of the first electrode; and a light emitting layer disposed on the portion of the first electrode exposed by the bank hole and extending onto a top surface of the bank, wherein the light emitting layer includes a central portion located within the bank hole and a peripheral portion located on the top surface of the bank, wherein the peripheral portion continuously surrounds the bank hole in a plan view, wherein the peripheral portion has a multi-tiered upper surface including a plurality of tiers arranged in a direction away from the bank hole, wherein the plurality of tiers have different heights relative to the top surface of the bank, and wherein the heights of the plurality of tiers stepwise decrease in a direction away from the bank hole.

14. The display device of claim 13, wherein the plurality of tiers include a first tier, a second tier, and a third tier arranged sequentially in the direction away from the bank hole.

15. The display device of claim 14, wherein the first tier is integrally connected to the central portion of the light emitting layer and extends outwardly from an edge of the bank hole.

16. The display device of claim 14, wherein in the plan view, the first tier, the second tier, and the third tier form concentric rings surrounding the bank hole.

17. The display device of claim 14, wherein the third tier defines an outermost edge of the light emitting layer, and the outermost edge is spaced apart from a light emitting layer of an adjacent sub-pixel.

18. The display device of claim 13, wherein the peripheral portion defines a stepped slope on the top surface of the bank that descends toward an adjacent sub-pixel, and wherein the stepped slope is defined by the plurality of tiers having different heights relative to the top surface of the bank.

19. The display device of claim 13, further comprising:

a second electrode disposed on the light emitting layer, wherein the second electrode overlaps the multi-tiered upper surface of the peripheral portion.

* * * * *